United States Patent [19]
Nagai

[11] Patent Number: 6,104,053
[45] Date of Patent: Aug. 15, 2000

[54] SEMICONDUCTOR DEVICE COMPRISING CAPACITOR IN LOGIC CIRCUIT AREA AND METHOD OF FABRICATING THE SAME

[75] Inventor: Yukihiro Nagai, Hyogo, Japan

[73] Assignee: Mitsubishi Denki Kabushiki Kaisha, Tokyo, Japan

[21] Appl. No.: 09/024,497

[22] Filed: Feb. 17, 1998

[30]  Foreign Application Priority Data

Sep. 1, 1997  [JP]  Japan ................................ 9-236033

[51] Int. Cl.$^7$ ................................................ H01L 27/108
[52] U.S. Cl. ...................... 257/303; 257/306; 257/307; 257/532; 438/241; 438/253; 438/396
[58] Field of Search .................................. 257/295, 296, 257/303, 311, 306–308, 532, 535, 758, 906, 908, FOR 306; 438/239, 241, 253, 396

[56]  References Cited

U.S. PATENT DOCUMENTS

| | | | |
|---|---|---|---|
| 5,389,558 | 2/1995 | Suwanai et al. | 438/241 |
| 5,608,248 | 3/1997 | Ohno | 257/306 |
| 5,767,541 | 6/1998 | Hanagasaki | 257/295 |
| 5,773,860 | 6/1998 | Kijima et al. | 257/306 |
| 5,864,153 | 1/1999 | Nagel et al. | 257/296 |
| 5,920,775 | 7/1999 | Koh | 438/241 |

FOREIGN PATENT DOCUMENTS

| | | |
|---|---|---|
| 59-188963 | 10/1984 | Japan . |
| 3-77365 | 4/1991 | Japan . |
| 5-283614 | 10/1993 | Japan . |

*Primary Examiner*—Donald L. Monin, Jr.
*Assistant Examiner*—Hoai Pham
*Attorney, Agent, or Firm*—McDermott, Will & Emery

[57]  ABSTRACT

Obtaining a semiconductor device which can reduce the occupied area of a capacitor in a logic circuit area while ensuring a constant capacitance without increasing the number of steps of fabricating the semiconductor device, and a method of fabricating the same. A first electrode of a capacitor is formed in the logic circuit area. A dielectric film consisting of a first interlayer isolation film is formed on the first electrode. A second electrode is formed on the first interlayer isolation film. A second dielectric film consisting of a second interlayer isolation film is formed on the second electrode. A third electrode is formed on the second interlayer isolation film. A connecting wire connects the first electrode and the third electrode with each other through openings in the first and third connecting regions.

6 Claims, 29 Drawing Sheets

SEMICONDUCTOR DEVICE COMPRISING CAPACITOR IN LOGIC CIRCUIT AREA AND METHOD OF FABRICATING THE SAME

BACKGROUND OF THE INVENTION

1. Field of the Invention

The present invention relates to a semiconductor device and a method of fabricating the same, and more specifically, it relates to a semiconductor device comprising a capacitor in a logic circuit area and a method of fabricating the same.

2. Description of the Background Art

In general, a semiconductor device such as a DRAM (dynamic random access memory) has a peripheral circuit area provided with a control logic circuit or the like around a memory cell area. A capacitor is generally employed in the logic circuit of the peripheral circuit area.

FIG. 41 is a sectional view showing a conventional semiconductor device (DRAM). The structure of the conventional semiconductor device is now described with reference to FIG. 41.

Referring to FIG. 41, the conventional semiconductor device comprises a memory cell area and a peripheral circuit area. The memory cell area is provided with field-effect transistors, a bit line 121, capacitors, and a metal wire 130. The peripheral circuit area is provided with a capacitor employed in a logic circuit.

In the memory cell area, field oxide films 102 are formed on a major surface of a semiconductor substrate 101. Source/drain regions 112, 113 and 114 are provided on the major surface of the semiconductor substrate 101 in an active region held between the field oxide films 102, to hold channel regions therebetween. Gate insulating films 132a and 132b are formed on the channel regions. Polysilicon films 106 are formed on the gate insulating films 132a and 132b. Tungsten silicide films 107 are formed on the polysilicon films 106. The polysilicon films 106 and the tungsten silicide films 107 form gate electrodes 110a and 110b. A first interlayer isolation film 115 is formed on the major surface of the semiconductor substrate 101 and the gate electrodes 110a and 110b. The first interlayer isolation film 115 is partially removed in a region positioned on the source/drain region 113, to define an opening 117. A polysilicon film 118 is formed in the opening 117 and on the first interlayer isolation film 115, to be in contact with the source/drain region 113. A tungsten silicide film 119 is formed on the polysilicon film 118. The polysilicon film 118 and the tungsten silicide film 119 form the bit line 121.

A second interlayer isolation film 122 is formed on the bit line 121 and the first interlayer isolation film 115. The first and second interlayer isolation films 115 and 122 are partially removed in regions positioned on the source/drain regions 112 and 114, to define openings 123 and 124. Lower electrodes 125 and 126 of capacitors consisting of polysilicon are formed in the openings 123 and 124 and on the second interlayer isolation film 122, to be in contact with the source/drain regions 112 and 114. Insulating films 142 for serving as dielectric films of the capacitors are formed on the lower electrodes 125 and 126. Upper electrodes 127 of the capacitors are formed on the insulating films 142. A third interlayer isolation film 128 is formed on the upper electrodes 127 and the second interlayer isolation film 122. The metal wire 130 is formed on the third interlayer isolation film 128.

The peripheral circuit area is provided with a capacitor. FIG. 41 shows sections of the capacitor taken along the lines 500—500 and 600—600 in FIG. 42 respectively. The positional relation between the lines 500—500 and 600—600 is described with reference to FIG. 42. FIG. 42 is a plan view typically showing the structure of the capacitor provided in the peripheral circuit area. Referring to FIG. 42, the line 500—500 is located on a portion of electrodes of the capacitor, and the line 600—600 is located on a portion provided with openings 138 and 139.

Referring again to FIG. 41, field oxide films 102 are formed on the major surface of the semiconductor substrate 101 in the section of the peripheral circuit area taken along the line 500—500. An insulating film 131 is formed on the major surface of the semiconductor substrate 101 in an active region held between the field oxide films 102. A polysilicon film 106 is formed on the insulating film 131. A tungsten silicide film 107 is formed on the polysilicon film 106. The polysilicon film 106 and the tungsten silicide film 107 form a lower electrode 111 of the capacitor provided in the peripheral circuit area. The first interlayer isolation film 115 is formed on the lower electrode 111 of the capacitor. A polysilicon film 118 is formed on the first interlayer isolation film 115. A tungsten silicide film 119 is formed on the polysilicon film 118. The polysilicon film 118 and the tungsten silicide film 119 form an upper electrode 120 of the capacitor in the peripheral circuit area. The second interlayer isolation film 122 is formed on the upper electrode 120 and the first interlayer isolation film 115. The third interlayer isolation film 128 is formed on the second interlayer isolation film 122.

In the section of the peripheral circuit area taken along the line 600—600, field oxide films 102 are formed on the major surface of the semiconductor substrate 101. An insulating film 131 is formed on a prescribed region of the major surface of the semiconductor substrate 101 in an active region held between the field oxide films 102. A polysilicon film 106 is formed on the insulating film 131. A tungsten silicide film 107 is formed on the polysilicon film 106. The polysilicon film 106 and the tungsten silicide film 107 form a connecting region 143 partially forming the lower electrode 111 of the capacitor provided in the peripheral circuit area. The first interlayer isolation film 115 is formed on the connecting region 143 and the major surface of the semiconductor substrate 101. A polysilicon film 118 is formed on a region of the first interlayer isolation film 115 positioned on the connecting region 143. A tungsten silicide film 119 is formed on the polysilicon film 118. The polysilicon film 118 and the tungsten silicide film 119 form a connecting region 144 partially forming the upper electrode 120 of the capacitor in the peripheral circuit area. The second interlayer isolation film 122 is formed on the connecting region 144 and the first interlayer isolation film 115. The third interlayer isolation film 128 is formed on the second interlayer isolation film 122.

The first to third interlayer isolation films 115, 122 and 128 are partially removed in regions positioned on the connecting region 143, to define the opening 139. Further, the second and third interlayer isolation films 122 and 128 are partially removed in regions positioned on the connecting region 144, to define the opening 138. A metal wire 135 is formed in the opening 139 and on the third interlayer isolation film 128, to be in contact with the connecting region 143. Another metal wire 134 is formed in the opening 138 and on the third interlayer isolation film 128, to be in contact with the connecting region 144. Thus, the lower electrode 111, the upper electrode 120 and a part of the first interlayer isolation film 155 located between the upper and lower electrodes 120 and 111 for serving as a dielectric film form the capacitor in the peripheral circuit area. FIG. 43 is an equivalent circuit diagram of the capacitor in the peripheral circuit area.

FIGS. 44 to 59 are sectional views for illustrating steps of fabricating the conventional semiconductor device (DRAM). The steps of fabricating the conventional semiconductor device are now described with reference to FIGS. 44 to 59.

First, an oxide film 103 (see FIG. 44) is formed on the major surface of the semiconductor substrate 101 (see FIG. 44). A nitride film 104 (see FIG. 44) is formed on the oxide film 103. Resist patterns (not shown) are formed on the nitride film 104, and employed as masks for partially removing the oxide film 103 and the nitride film 104. Then, the major surface of the semiconductor substrate 101 is oxidized, to form the field oxide films 102 (see FIG. 44). Thus, the structure shown in FIG. 44 is obtained. Then, the remaining nitride and oxide films 104 and 103 are removed from the major surface of the semiconductor substrate 101, to obtain the structure shown in FIG. 45.

Then, an oxide film 105 is formed on the major surface of the semiconductor substrate 101, as shown in FIG. 46. A polysilicon film 106 is formed on the oxide film 105 and the field oxide films 102. A tungsten silicide film 107 is formed on the polysilicon film 106. Resist patterns 108 and 109 are formed on the tungsten silicide film 107.

Then, the tungsten silicide film 107, the polysilicon film 106 and the oxide film 105 are partially removed by etching through the resist patterns 108 and 109 serving as masks. Thereafter the resist patterns 108 and 109 are removed. Thus, the structure shown in FIG. 47 is obtained. The polysilicon films 106 and the tungsten silicide films 107 form the gate electrodes 110a and 110b of the field-effect transistors in the memory cell area. In the peripheral circuit area, the polysilicon film 106 and the tungsten silicide film 107 form the lower electrode 111 and the connecting region 143 of the capacitor.

Then, impurity ions are implanted into prescribed regions of the major surface of the semiconductor substrate 101 in the memory cell area, to form the source/drain regions 112, 113 and 114 (see FIG. 48). Thus, the structure shown in FIG. 48 is obtained.

Then, the first interlayer isolation film 115 is formed on the gate electrodes 110a and 110b and the lower electrode 111 and the connecting region 143 of the capacitor in the peripheral circuit area, as shown in FIG. 49. Resist patterns 116 are formed on the first interlayer isolation film 115.

Then, the first interlayer isolation film 115 is partially removed by anisotropic etching through the resist patterns 116 serving as masks, to define the opening 117 (see FIG. 50). Thereafter the resist patterns 116 are removed. Thus, the structure shown in FIG. 50 is obtained.

Then, a polysilicon film 118 is formed in the opening 117 and on the first interlayer isolation film 115, as shown in FIG. 51. A tungsten silicide film 119 is formed on the polysilicon film 118.

Then, resist patterns (not shown) are formed on the tungsten silicide film 119, and employed as masks for partially removing the tungsten silicide film 119 and the polysilicon film 118 by etching. Thus, the bit line 121 in the memory cell area and the upper electrode 120 and the connecting region 144 of the capacitor in the peripheral circuit area are formed as shown in FIG. 52. The bit line 121 and the upper electrode 120 and the connecting region 144 of the capacitor in the peripheral circuit area are formed by the polysilicon films 118 and the tungsten silicide films 119 respectively.

Then, the second interlayer isolation film 122 (see FIG. 53) is formed on the bit line 121, the upper electrode 120 and the connecting region 144 of the capacitor in the peripheral circuit area and the first interlayer isolation film 115. Resist patterns (not shown) are formed on the second interlayer isolation film 122 and employed as masks for partially removing the first and second interlayer isolation films 115 and 122 by etching, to define the openings 123 and 124 (see FIG. 53). Thereafter the resist patterns are removed. Thus, the structure shown in FIG. 53 is obtained.

Then, a polysilicon film (not shown) is formed in the openings 123 and 124 and on the second interlayer isolation film 122. Resist patterns (not shown) are formed on the polysilicon film and employed as masks for partially removing the polysilicon film by anisotropic etching, to form the lower electrodes 125 and 126 (see FIG. 54) of the capacitors in the memory cell area. Thereafter the resist patterns are removed. Thus, the structure shown in FIG. 54 is obtained.

Then, an oxide film (not shown) is formed on the lower electrodes 125 and 126 and the second interlayer isolation film 122. A polysilicon film (not shown) is formed on the oxide film. Resist patterns (not shown) are formed on the polysilicon film and employed as masks for partially removing the polysilicon film and the oxide film. Thereafter the resist patterns are removed. Thus, the upper electrodes 127 of the capacitors in the memory area and the oxide films 142 for serving as dielectric films are formed as shown in FIG. 55.

Then, the third interlayer isolation film 128 is formed on the upper electrodes 127 of the capacitors and the second interlayer isolation film 122, as shown in FIG. 56.

Then, resist patterns 136 are formed on the third interlayer isolation film 128, as shown in FIG. 57.

Then, the first to third interlayer isolation films 115, 122 and 128 are partially removed by anisotropic etching through the resist patterns 136 serving as masks, to define the openings 138 and 139 (see FIG. 58) in the peripheral circuit area. Thereafter the resist patterns 136 are removed, to obtain the structure shown in FIG. 58. At this time, surfaces of the connecting regions 143 and 144 are partially exposed on bottom portions of the openings 138 and 139 respectively.

Then, a metal layer 129 is formed in the openings 138 and 139 and on the third interlayer isolation film 128, as shown in FIG. 59.

Then, resist patterns (not shown) are formed on the metal layer 129 and employed as masks for partially removing the metal layer 129 by anisotropic etching, and the resist patterns are removed, to obtain the structure shown in FIG. 41.

The conventional semiconductor device is fabricated in the aforementioned manner.

In recent years, refinement and high integration of a semiconductor device are increasingly required. In order to increase the degree of integration of a DRAM, for example, it is important to refine not only elements in a memory cell area but those in a peripheral circuit area. In the peripheral circuit area of the DRAM, capacitors occupy 20 to 30% of its area. Further, a capacitance exceeding a certain constant value must be ensured for the capacitor in the peripheral circuit area, since a driving voltage is not remarkably reduced following size reduction of the semiconductor device. Following refinement and high integration of the semiconductor device, therefore, it is necessary to reduce the occupied area of the capacitor while ensuring a capacitance exceeding a constant value for the capacitor.

In the capacitor formed in the peripheral circuit area of the conventional semiconductor device, the depths of the openings 138 and 139 simultaneously formed by etching are different from each other, as shown in FIG. 58. After the opening 138 reaches the surface of the connecting region 144, therefore, the surface of the connecting region 144 is still continuously etched on the bottom portion of the opening 138 until the opening 139 reaches the connecting region 143. Thus, the opening 138 may pass through the connecting region 144 to reach the connecting region 143, as shown in FIG. 60. In this case, the capacitor formed in the peripheral circuit area disadvantageously loses its function, due to short-circuiting across the upper and lower electrodes 120 and 111 (see FIG. 41). This results in a significant problem with size reduction of the capacitor in the peripheral circuit area following refinement and high integration of the semiconductor device. In refinement and high integration of the semiconductor device, therefore, required is a highly reliable capacitor which will not lose its function.

On the other hand, the steps of fabricating the capacitor in the peripheral circuit area must be based on utilization of conductive layers etc. in the steps of fabricating the elements in the memory cell area for minimizing the number of the steps, in order to reduce the fabrication cost. Therefore, a technique of stereoscopically complicating the shapes of electrodes of capacitors for increasing the surface areas thereof, which is applied to the capacitances of the capacitors in the memory cell area, is not applied to the capacitor in the peripheral circuit area, since this results in complication of the fabrication steps and increase of the number thereof. Thus, awaited is a highly reliable capacitor structure and a method of fabricating the same which can reduce the occupied area of the capacitor while ensuring a constant capacitance with no complication of fabrication steps.

SUMMARY OF THE INVENTION

An object of the present invention is to provide a semiconductor device which can reduce the occupied area of a capacitor in a logic circuit area while ensuring a constant capacitance, without increasing the number of steps of fabricating the semiconductor device.

Another object of the present invention is to provide a semiconductor device which can reduce the occupied area of a capacitor in a logic circuit area while ensuring a constant capacitance and reliability, without increasing the number of steps of fabricating the semiconductor device.

Still another object of the present invention is to provide a method of fabricating a semiconductor device which can reduce the occupied area of a capacitor in a logic circuit area while ensuring a constant capacitance, without increasing the number of steps of fabricating the semiconductor device.

A further object of the present invention is to provide a method of fabricating a semiconductor device which can reduce the occupied area of a capacitor in a logic circuit area while ensuring a constant capacitance and reliability, without increasing the number of steps of fabricating the semiconductor device.

In a semiconductor device according to an aspect of the present invention, a first electrode consisting of a first conductive layer is formed in a logic circuit area. A first dielectric film consisting of a first interlayer isolation film is formed on the first electrode. A second electrode consisting of a second conductive layer is formed on the first dielectric film. A second dielectric film consisting of a second interlayer isolation film is formed on the second electrode. A third electrode consisting of a third conductive layer is formed on the second dielectric film. The first, second and third electrodes and the first and second dielectric films form capacitors. A third interlayer isolation film is formed on the third electrode. A first opening is formed at least through the first, second and third interlayer isolation films, to reach the upper surface of the first electrode. A second opening is formed at least through the second and third interlayer isolation films, to reach the upper surface of the second electrode. A third opening is formed at least through the third interlayer isolation film, to reach the upper surface of the third electrode. The first electrode has a first connecting region whose surface is exposed in the first opening. The second electrode has a second connecting region whose surface is exposed in the second opening. The third electrode has a third connecting region whose surface is exposed in the third opening. The first and third connecting regions are connected with each other by a connecting wire through the first and third openings.

The semiconductor device according to this aspect utilizes the first and second interlayer isolation films as the dielectric films of the capacitors in the logic circuit area. Thus, when another area is provided with an element consisting of a plurality of conductive layers formed through the first and second interlayer isolation films, for example, the electrodes of the capacitors in the logic circuit area can be formed by the same conductive layers as those forming the element. Therefore, steps of forming the capacitors in the logic circuit area can be carried out simultaneously with those for forming another element. Consequently, it is possible to prevent the number of steps from being increased due to formation of the capacitors in the logic circuit area.

In this semiconductor device, further, the first to third electrodes are stacked with each other through the first and second dielectric films while the first and third electrodes are connected with each other in the first and third connecting regions through the first and third openings, whereby a first capacitor formed by the first electrode, the first dielectric film and the second electrode can be connected in parallel with a second capacitor formed by the second electrode, the second dielectric film and the third electrode. Even if the areas of the first to third electrodes of the capacitors are reduced to reduce the occupied areas of the capacitors, therefore, necessary capacitances can be ensured since the plurality of capacitors are connected in parallel with each other.

Consequently, it is possible to reduce the occupied areas of the capacitors on the semiconductor substrate while ensuring constant capacitances required for the capacitors in the logic circuit area, without increasing the number of steps of fabricating the semiconductor device.

In the structure of the semiconductor device according to this aspect, the second connecting region may be arranged not to planarly overlap with the first electrode. Due to this structure, the second opening can be prevented from coming into contact with the first electrode even if the same passes through the second connecting region to reach the first interlayer isolation film. Consequently, the first capacitor is prevented from losing its function due to undesirable connection between the first and second electrodes having different potentials. Thus, it is possible to obtain a semiconductor device comprising highly reliable capacitors in its logic circuit area.

In the structure of the semiconductor device according to this aspect, a conductive region may be formed under the first electrode through a fourth interlayer isolation film on the major surface of the semiconductor substrate, a fourth opening may be formed through the first, second and third interlayer isolation films to reach the conductive region, and the second connecting region of the second electrode may be electrically connected with the conductive region through the second and fourth openings.

Thus, the conductive region is formed under the first electrode through the fourth interlayer isolation film on the major surface of the semiconductor substrate, whereby a third capacitor can be formed by the conductive region, a dielectric film consisting of the fourth interlayer isolation film and the first electrode. The second connecting region of the second electrode and the conductive region are electrically connected with each other through the second and fourth openings, whereby the third capacitor can be further connected in parallel with the first and second capacitors. Thus, the occupied areas of the capacitors can be further reduced by further reducing the areas of the first to fourth electrodes thereof while ensuring necessary capacitances of the capacitors.

In the structure of the semiconductor device according to this aspect, a fourth electrode consisting of a fourth conductive layer may be formed on the third interlayer isolation film. A fifth interlayer isolation film may be formed on the fourth electrode. A fourth opening may be formed through the fifth interlayer isolation film, to reach the fourth electrode. The second and fourth electrodes may be electrically connected with each other through the second and fourth openings.

Thus, the fourth electrode consisting of the fourth conductive layer is formed on the third interlayer isolation film, whereby a third capacitor can be formed by the third electrode, a dielectric film consisting of the third interlayer isolation film and the fourth electrode. The second and fourth electrodes are electrically connected with each other through the second and fourth openings, whereby the third capacitor can be further connected in parallel with the first and second capacitors. Thus, the occupied areas of the capacitors can be further reduced by further reducing the areas of the first to fourth electrodes thereof while ensuring necessary capacitances of the capacitors.

In the structure of the semiconductor device according to this aspect, the logic circuit area may be a peripheral circuit area of a semiconductor memory device comprising a memory cell area and the peripheral circuit area. Thus, the aforementioned capacitors are formed in the peripheral circuit area of the semiconductor memory device comprising the memory cell area and the peripheral circuit area. Refinement and high integration are particularly strongly required for a semiconductor memory device among semiconductor devices, and the capacitors of the peripheral circuit area occupy about 30% of its area. Thus, reduction of the occupied areas of the capacitors in the peripheral circuit area exhibits a further remarkable effect for high integration of the semiconductor memory device.

A semiconductor device according to another aspect of the present invention comprises a memory cell area and a peripheral circuit area. The memory cell area is provided with a pair of source/drain regions formed on a major surface of a semiconductor substrate to hold a channel region therebetween, a gate insulating film formed on the channel region, and a gate electrode consisting of a first conductive layer formed on the gate insulating film. The pair of source/drain regions, the gate insulating film and the gate electrode form a field-effect transistor. A first interlayer isolation film is formed on the gate electrode. A bit line consisting of a conductive film is formed to be electrically connected to one of the source/drain regions and to extend on the first interlayer isolation film. A second interlayer isolation film is formed on the bit line. A lower electrode is formed to be electrically connected to another one of the source/drain regions and to extend on the second interlayer isolation film. A dielectric film is formed on the lower electrode. An upper electrode consisting of a third conductive layer is formed on the dielectric film. The lower electrode, the dielectric film and the upper electrode form a capacitor. A third interlayer isolation film is formed on the upper electrode. A wiring layer is formed on the third interlayer isolation film.

The peripheral circuit area is provided with a first electrode formed on the major surface of the semiconductor substrate, a first dielectric film consisting of the first interlayer isolation film formed on the first electrode, a second electrode consisting of a second conductive layer formed on the first dielectric film, a second dielectric film consisting of the second interlayer isolation film formed on the second electrode, and a third electrode consisting of the third conductive layer formed on the second dielectric film. The third interlayer isolation film is formed on the third electrode. A first opening is formed at least through the first, second and third interlayer isolation films, to reach the upper surface of the first electrode. A second opening is formed at least through the second and third interlayer isolation films, to reach the upper surface of the second electrode. A third opening is formed at least through the third interlayer isolation film, to reach the upper surface of the third electrode. The first electrode has a first connecting region whose surface is exposed in the first opening. The second electrode has a second connecting region whose surface is exposed in the second opening. The third electrode has a third connecting region whose surface is exposed in the third opening. The first and third connecting regions are connected with each other by a connecting wire through the first and third openings.

Thus, the first and second interlayer isolation films are utilized as dielectric films of capacitors in the peripheral circuit area. Therefore, when the memory cell area is provided with an element such as a field-effect transistor consisting of a plurality of conductive layers formed through the first and second interlayer isolation films, for example, the electrodes of the capacitors in the peripheral circuit area can be formed by the same conductive layers as those forming the element. Thus, steps of forming the capacitors in the peripheral circuit area can be carried out simultaneously with those for forming another element in the memory cell area. Consequently, it is possible to prevent the number of fabricating steps from being increased due to formation of the capacitors in the peripheral circuit area.

Further, the first to third electrodes are stacked with each other through the first and second dielectric films while the first and third electrodes are connected with each other through the first and third openings, whereby a first capacitor formed by the first electrode, the first dielectric film consisting of the first interlayer isolation film and the second electrode and a second capacitor formed by the second electrode, the second dielectric film consisting of the second interlayer isolation film and the third electrode can be connected in parallel with each other. Even if the areas of the first to third electrodes of the capacitors are reduced to reduce the occupied areas of the capacitors, therefore, necessary capacitances can be ensured since the plurality of capacitors are connected in parallel with each other.

Consequently, it is possible to reduce the occupied areas of the capacitors on the semiconductor substrate while ensuring constant capacitances required for the capacitors in the peripheral circuit area, without increasing the number of steps of fabricating the semiconductor device.

In such a semiconductor device comprising a memory cell area and a peripheral circuit area represented by a DRAM, capacitors of the peripheral circuit area occupy about 30% of its area, and hence reduction of the occupied areas of the capacitors in the peripheral circuit area exhibits a further remarkable effect for high integration of the semiconductor device.

In a method of fabricating a semiconductor device according to still another aspect of the present invention, a first electrode of a capacitor consisting of a first conductive layer and having a first connecting region is formed in a logic circuit area. A first dielectric film consisting of a first interlayer isolation film is formed on the first electrode. A second electrode of a capacitor consisting of a second conductive layer and having a second connecting region is formed on the first dielectric film. A second dielectric film consisting of a second interlayer isolation film is formed on the second electrode. A third electrode of a capacitor consisting of a third conductive layer and having a third connecting region is formed on the second dielectric film. A third interlayer isolation film is formed on the third electrode. The first to third interlayer isolation films are partially removed by anisotropic etching, for defining a first opening to expose a surface of the first connecting region. The second and third interlayer isolation films are partially removed by anisotropic etching, for defining a second opening to expose a surface of the second connecting region. The third interlayer isolation film is partially removed by anisotropic etching, for defining a third opening to expose a surface of the third connecting region. A connecting wire is formed in the first and third openings, to connect the first and third connecting regions with each other.

Thus, the interlayer isolation films are utilized as the dielectric films of the capacitors in the logic circuit area. Therefore, when another area is provided with an element such as a field-effect transistor consisting of a plurality of conductive layers formed through the first and second interlayer isolation films, for example, the electrodes of the capacitors in the logic circuit area can be formed by the same conductive layers as those forming the element. Thus, steps of forming the capacitors in the logic circuit area can be carried out simultaneously with those for forming the element. Consequently, it is possible to prevent the number of fabricating steps from being increased due to formation of the capacitors in the logic circuit area.

Further, the first to third electrodes are stacked with each other through the first and second dielectric films while the first and third electrodes are connected with each other in the first and third connecting regions through the first and third openings, whereby a first capacitor formed by the first electrode, the first dielectric film and the second electrode can be connected in parallel with a second capacitor formed by the second electrode, the second dielectric film and the third electrode. Even if the areas of the first to third electrodes of the capacitors are reduced to reduce the occupied areas of the capacitors, therefore, necessary capacitances can be ensured since the plurality of capacitors are connected in parallel with each other.

Consequently, it is possible to reduce the occupied areas of the capacitors on the semiconductor substrate while ensuring constant capacitances required for the capacitors in the logic circuit area, without increasing the number of steps of fabricating the semiconductor device.

In the method of fabricating a semiconductor device according to this aspect, the second connecting region may be formed on a position not planarly overlapping with the first electrode. Due to this structure, the second opening can be prevented from coming into contact with the first electrode even if the second opening passes through the second connecting region to reach the first interlayer isolation film in a step of forming the same. Consequently, the first capacitor is prevented from losing its function due to undesirable connection between the first and second electrodes having different potentials. Thus, it is possible to obtain a semiconductor device comprising highly reliable capacitors in its logic circuit area.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(Embodiment 1)

A semiconductor device according to an embodiment 1 of the present invention are now described with reference to FIG. 1.

Figure 1:
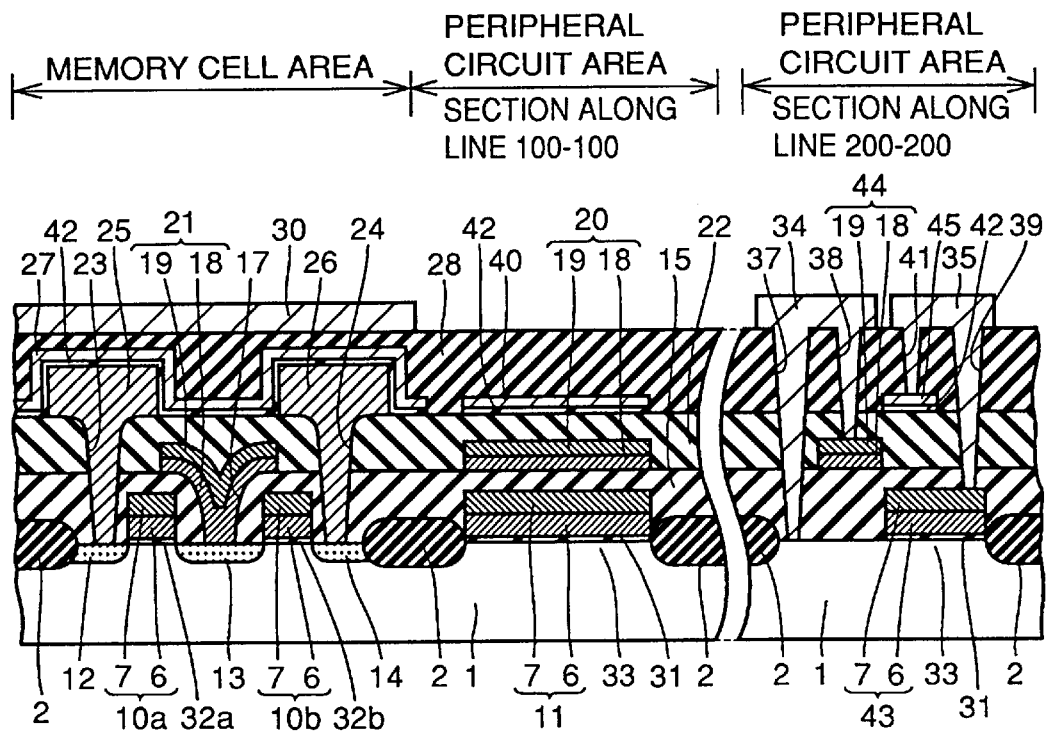
FIG. 1 is a sectional view showing a semiconductor device according to an embodiment 1 of the present invention.

Referring to FIG. 1, the semiconductor device according to the embodiment 1 of the present invention comprises a memory cell area and a peripheral circuit area. The memory cell area is provided with field-effect transistors, a bit line 21, capacitors in the memory cell area, and a metal wire 30. The peripheral circuit area is provided with capacitors having first to third electrodes 11, 20 and 40 and a conductive region 33.

In the memory cell area, field oxide films 2 are formed on a major surface of a semiconductor substrate 1. Source/drain regions 12, 13 and 14 are formed on the major surface of the semiconductor substrate 1 in an active region held between the field oxide films 2, to hold channel regions therebetween. Gate insulating films 32a and 32b are formed on the channel regions. Polysilicon films 6 are formed on the gate insulating films 32a and 32b. Tungsten silicide films 7 are formed on the polysilicon films 6. The polysilicon films 6 and the tungsten silicide films 7 form gate electrodes 10a and 10b. The gate electrode 10a, the gate insulating film 32a and the source/drain regions 12 and 13 form a first field-effect transistor. The gate electrode 10b, the gate insulating film 32b and the source/drain regions 13 and 14 form a second field-effect transistor. A first interlayer isolation film 15 is formed on the gate electrodes 10a and 10b of the field-effect transistors and the major surface of the semiconductor substrate 1. The first interlayer isolation film 15 is partially removed by anisotropic etching in a region positioned on the source/drain region 13, to define an opening 17. A polysilicon film 18 is formed in the opening 17 and on the first interlayer isolation film 15. A tungsten silicide film 19 is formed on the polysilicon film 18. The polysilicon film 18 and the tungsten silicide film 19 form a bit line 21.

A second interlayer isolation film 22 is formed on the bit line 21 and the first interlayer isolation film 15. The first and second interlayer isolation films 15 and 22 are partially removed by anisotropic etching in regions positioned on the source/drain regions 12 and 14, to define openings 23 and 24. Lower electrodes 25 and 26 of the capacitors consisting of polysilicon are formed in the openings 23 and 24 and on the second interlayer isolation film 22. A dielectric film 42 consisting of an insulating film is formed on the lower electrodes 25 and 26 and the second interlayer isolation film 22. An upper electrode 27 is formed on the dielectric film 42. A third interlayer isolation film 28 is formed on the upper electrode 27 and the second interlayer isolation film 22. A metal wire 30 is formed on the third interlayer isolation film 28.

Figure 2:
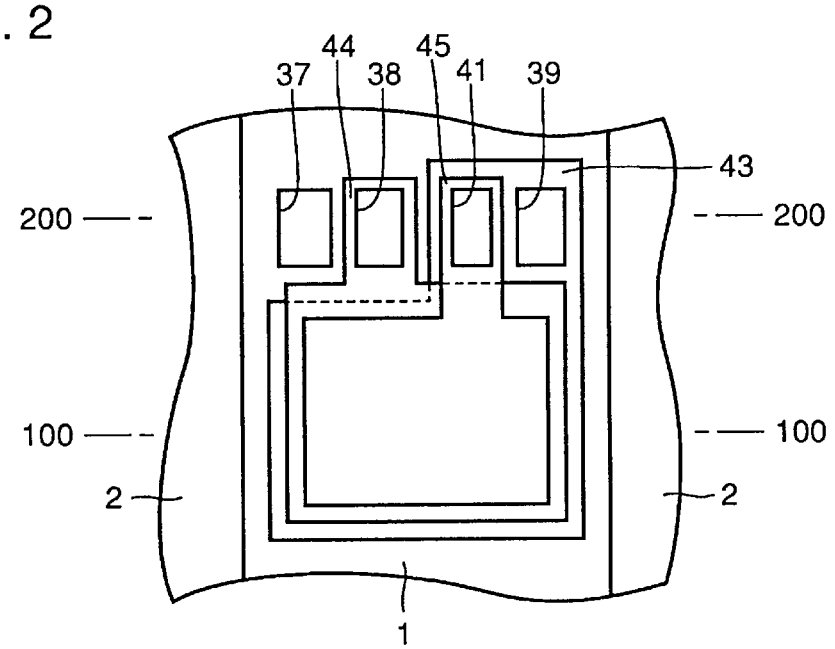
FIG. 2 is a plan view typically showing the structure of capacitors formed in a peripheral circuit area of the semiconductor device according to the embodiment 1 shown in FIG. 1.

The peripheral circuit area is provided with capacitors which are employed in a logic circuit. FIG. 1 shows sections of the capacitors taken along the lines 100—100 and 200—200 in FIG. 2. The positional relation between the lines 100—100 and 200—200 is described with reference to FIG. 2. Referring to FIG. 2, the line 100—100 is located on electrode parts of the capacitors, and the line 200—200 is located on a region provided with openings 37, 38, 41 and 39 for connecting the electrodes with each other.

Referring again to FIG. 1, field oxide films 2 are formed on the major surface of the semiconductor substrate 1 in the section of the peripheral circuit area taken along the line 100—100. A conductive region 33 into which an impurity is injected is formed on the major surface of the semiconductor substrate 1 in an active region held between the field oxide films 2. An insulating film 31 is formed on the major surface of the semiconductor substrate 1 in a position located on the conductive region 33. A polysilicon film 6 is formed on the insulating film 31. A tungsten silicide film 7 is formed on the polysilicon film 6. The polysilicon film 6 and the tungsten silicide film 7 form a first electrode 11 of the capacitors. The first interlayer isolation film 15 is formed on the first electrode 11. A polysilicon film 18 is formed on the first interlayer isolation film 15 in a region located on the first electrode 11. A tungsten silicide film 19 is formed on the polysilicon film 18. The polysilicon film 18 and the tungsten silicide film 19 form a second electrode 20 of the capacitors. The second interlayer isolation film 22 is formed on the second electrode 20 and the first interlayer isolation film 15. An insulating film 42 is formed on the second interlayer isolation film 22 in a region located on the second electrode 20. A third electrode 40 of the capacitors is formed on the insulating film 42. The third interlayer isolation film 28 is formed on the third electrode 40 of the capacitors.

In the section of the peripheral circuit area taken along the line 200—200, field oxide films 2 are formed on the major surface of the semiconductor substrate 1. A conductive region 33 into which an impurity is injected is formed on a prescribed region of the major surface of the semiconductor substrate 1 in an active region held between the field oxide films 2. An insulating film 31 is formed on a prescribed region of the major surface of the semiconductor substrate 1 in a region located on the conductive region 33. A polysilicon film 6 is formed on the insulating film 31. A tungsten silicide film 7 is formed on the polysilicon film 6. The polysilicon film 6 and the tungsten silicide film 7 form a first connecting region 43 of the first electrode 11.

The first interlayer isolation film 15 is formed on the connecting region 43 and the major surface of the semiconductor substrate 1. A polysilicon film 18 is formed on a region of the first interlayer isolation film 15 not planarly overlapping with the first connecting region 43. A tungsten silicide film 19 is formed on the polysilicon film 18. The polysilicon film 18 and the tungsten silicide film 19 form a second connecting region 44 of the second electrode 20. The second interlayer isolation film 22 is formed on the second connecting region 44 and the first interlayer isolation film 15. An insulating film 42 is formed on a position of the second interlayer isolation film 22 planarly overlapping with the first connecting region 43. A third connecting region 45 of the third electrode 40 consisting of a conductive film is formed on the insulating film 42. The third interlayer isolation film 28 is formed on the third connecting region 45 and the second interlayer isolation film 22.

The first to third interlayer isolation films 15, 22 and 28 are partially removed by anisotropic etching, for defining the opening 37 to be in contact with the conductive region 33 on the major surface of the semiconductor substrate 1. The first to third interlayer isolation films 15, 22 and 28 are further partially removed by anisotropic etching, for defining the opening 39 to be in contact with the first connecting region 43. The second and third interlayer isolation films 22 and 28 are partially removed by anisotropic etching, for defining the opening 38 to be in contact with the second connecting region 44. The third interlayer isolation film 28 is partially removed by anisotropic etching, for defining the opening 41 to be in contact with the third connecting region 45. A metal wire 34 is formed in the openings 37 and 38 and on the third interlayer isolation film 28. This metal wire 34 connects the conductive region 33 on the major surface of the semiconductor substrate 1 and the second connecting region 44 with each other. Another metal wire 35 is formed in the openings 41 and 39 and on the third interlayer isolation film 28. This metal wire 35 connects the first and third connecting regions 43 and 45 with each other.

Figure 3:
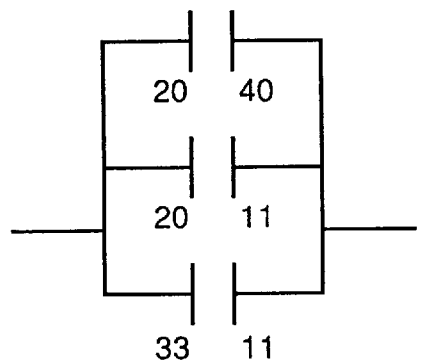
FIG. 3 is an equivalent circuit diagram of the capacitors formed in the peripheral circuit area of the semiconductor device according to the embodiment 1 shown in FIG. 1.

Due to the aforementioned structure, a plurality of capacitors can be formed in the peripheral circuit area. In more concrete terms, a lower electrode consisting of the conductive region 33 of the semiconductor substrate 1, a dielectric film consisting of the insulating film 31 and an upper electrode consisting of the first electrode 11 form a first capacitor. A lower electrode consisting of the first electrode 11, a dielectric film consisting of the first interlayer isolation film 15 and an upper electrode consisting of the second electrode 20 form a second capacitor. A lower electrode consisting of the second electrode 20, a dielectric film consisting of the second interlayer isolation film 22 and an upper electrode consisting of the third electrode 40 form a third capacitor. The metal wires 34 and 35 connect these electrodes with each other, whereby the first to third capacitors can be connected in parallel with each other as shown in FIG. 3.

According to the embodiment 1 of the present invention, the first to third interlayer isolation films 15, 22 and 28 are utilized as the dielectric films of the capacitors in the peripheral circuit area. Thus, when the memory cell area is provided with elements such as the field-effect transistors and the capacitors through the first to third interlayer isolation films 15, 22 and 28, for example, the electrodes of the capacitors in the peripheral circuit area can be formed by the polysilicon films 6 and 18, the tungsten silicide films 7 and 19 and the like for forming the gate electrodes 10a and 10b etc. of these elements. Therefore, steps of forming the capacitors in the peripheral circuit area can be carried out simultaneously with those for forming the elements in the memory cell area. Thus, it is possible to prevent the number of fabrication steps from being increased due to formation of the capacitors in the peripheral circuit area.

Further, the first to third electrodes 11, 20 and 40 are stacked with each other through the first and second interlayer isolation films 15 and 22, and the first and third electrodes 11 and 40 are connected with each other by the metal wire 35 through the openings 39 and 41. Thus, the second capacitor formed by the first electrode 11, the dielectric film consisting of the first interlayer isolation film 15 and the second electrode 20 can be connected in parallel with the third capacitor formed by the second electrode 20, the dielectric film consisting of the second interlayer isolation film 22 and the third electrode 40, as shown in FIG. 3.

In addition, the conductive region 33 on the major surface of the semiconductor substrate 1 and the second electrode 20 are connected with each other through the openings 37 and 38, whereby the first capacitor formed by the conductive region 33 on the major surface of the semiconductor substrate 1, the insulating film 31 and the first electrode 11 is also connected in parallel with the second and third capacitors. Thus, the first to third capacitors are connected in parallel with each other, whereby necessary capacitances can be ensured even if the areas occupied by the electrodes 11, 20 and 40 of the capacitors are reduced.

The second connecting region 44 is arranged not to planarly overlap with the first electrode 11, whereby the opening 38 can be prevented from coming into contact with the first electrode 11 even if the same passes through the second connecting region 44 to reach the first interlayer isolation film 15 in a step of forming the opening 38. Consequently, the capacitors can be prevented from losing functions thereof due to undesirable connection between the second electrode 20 and the first electrode 11.

Thus, it is possible to reduce the occupied areas of the capacitors of the peripheral circuit area on the semiconductor substrate 1 while ensuring constant capacitances required for the capacitors, without increasing the number of steps of fabricating the semiconductor device, and to obtain a semiconductor device comprising highly reliable capacitors.

In a semiconductor device, such as that according to the embodiment 1, represented by a DRAM comprising a memory cell area and a peripheral circuit area, occupied areas of capacitors of the peripheral circuit area are about 30% of its area, and hence reduction of the occupied areas of the capacitors in the peripheral circuit area exhibits a further remarkable effect for high integration of the semiconductor device.

With reference to FIGS. 4 to 19, steps of fabricating the semiconductor device according to the embodiment 1 of the present invention are now described.

Figure 4:
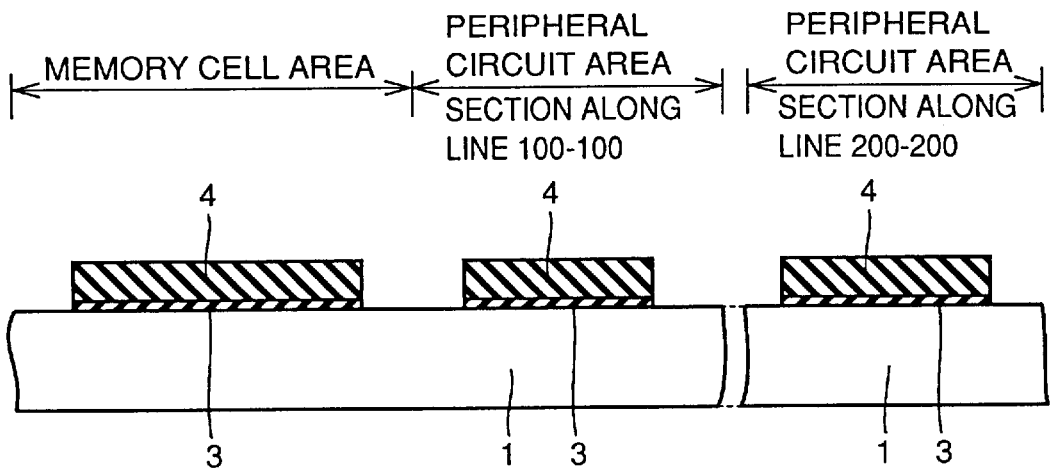
FIGS. 4 to 19 are sectional views for illustrating first to sixteenth steps of fabricating the semiconductor device according to the embodiment 1 shown in FIG. 1.

First, an oxide film 3 (see FIG. 4) is formed on the major surface of the semiconductor substrate 1 (see FIG. 4). A nitride film 4 (see FIG. 4) is formed on the oxide film 3. Resist patterns (not shown) are formed on the nitride film 4. The nitride film 4 and the oxide film 3 are partially removed by anisotropic etching through the resist patterns serving as masks. Thereafter the resist patterns are removed, to obtain the structure shown in FIG. 4.

Figure 5:
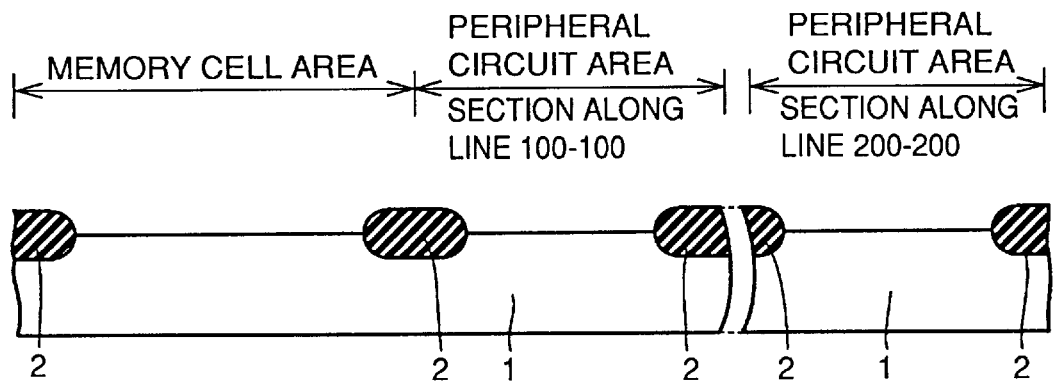

Then, the major surface of the semiconductor substrate 1 is oxidized, to form the field oxide films 2 (see FIG. 5). The oxide and nitride films 3 and 4 are removed, to obtain the structure shown in FIG. 5.

Figure 6:
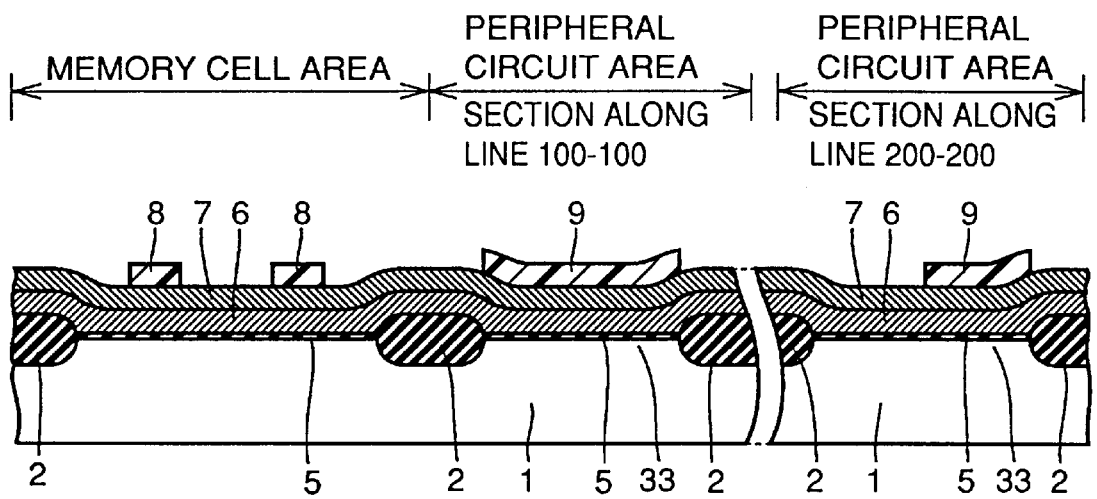

As shown in FIG. 6, an impurity is injected into a prescribed region of the major surface of the semiconductor substrate 1 in the peripheral circuit area for forming the conductive region 33, and thereafter oxide films 5 are formed on the major surface of the semiconductor substrate 1. A polysilicon film 6 is formed on the oxide films 5 and the field oxide films 2. A tungsten silicide film 7 is formed on the polysilicon film 6. Resist patterns 8 and 9 are formed on the tungsten silicide film 7.

Then, the polysilicon film 6, the tungsten silicide film 7 and the oxide films 5 are partially removed by etching through the resist patterns 8 and 9 serving as masks. Thereafter the resist patterns 8 and 9 are removed, to obtain the structure shown in FIG. 7. In the memory cell area, the polysilicon films 6 and the tungsten silicide films 7 form the gate electrodes 10a and 10b of the field-effect transistors. In the section of the peripheral circuit area taken along the line 100—100, the polysilicon film 6 and the tungsten silicide film 7 form the first electrode 11 of the capacitors. In the section of the peripheral circuit area taken along the line 200—200, the polysilicon film 6 and the tungsten silicide film 7 form the first connecting region 43 of the first electrode 11 of the capacitors.

Figure 8:
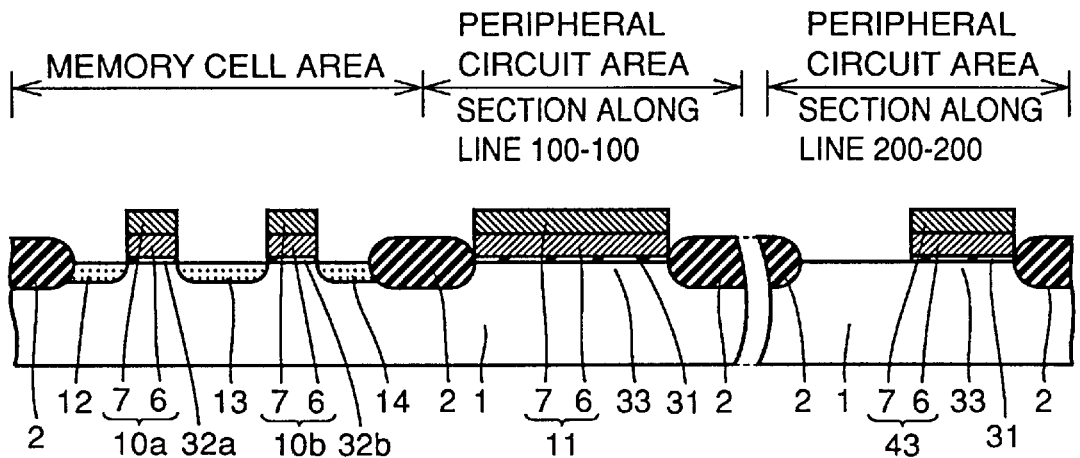

Then, a resist pattern (not shown) is formed on the peripheral circuit area and thereafter an impurity is injected into the major surface of the semiconductor substrate 1 in the memory cell area, to form the source/drain regions 12, 13 and 14 (see FIG. 8). Thereafter the resist pattern is removed, to obtain the structure shown in FIG. 8.

Figure 9:
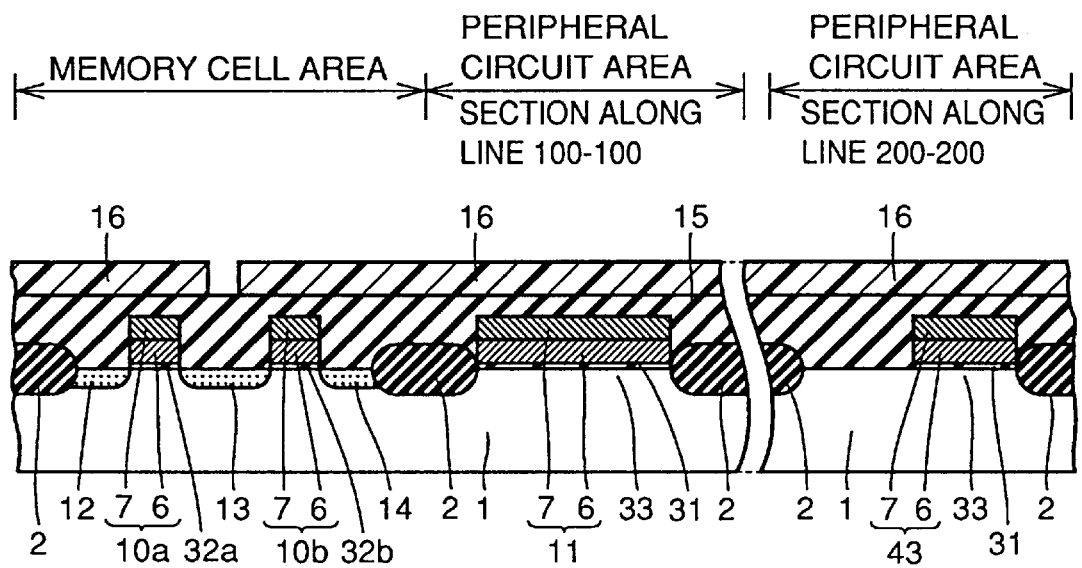

Then, the first interlayer isolation film 15 is formed on the gate electrodes 10a and 10b, the first electrode 11, the first connecting region 43, the major surface of the semiconductor substrate 1 and the field oxide films 2, as shown in FIG. 9. Resist patterns 16 are formed on the first interlayer isolation film 15.

Figure 10:
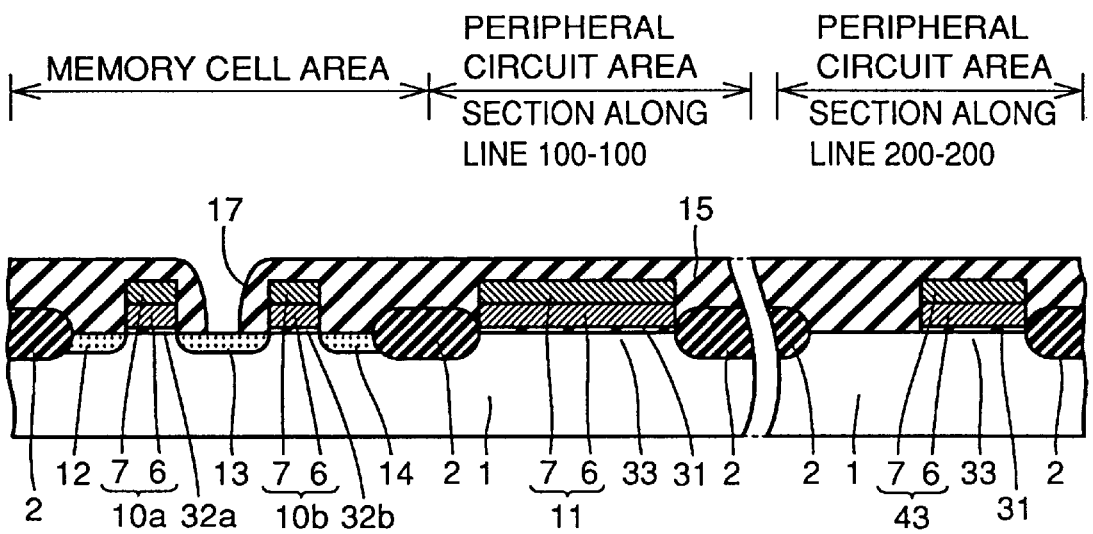

Then, the first interlayer isolation film 15 is partially removed through the resist patterns 16 serving as masks, to define the opening 17 (see FIG. 10). Thereafter the resist patterns 16 are removed, to obtain the structure shown in FIG. 10.

Figure 11:
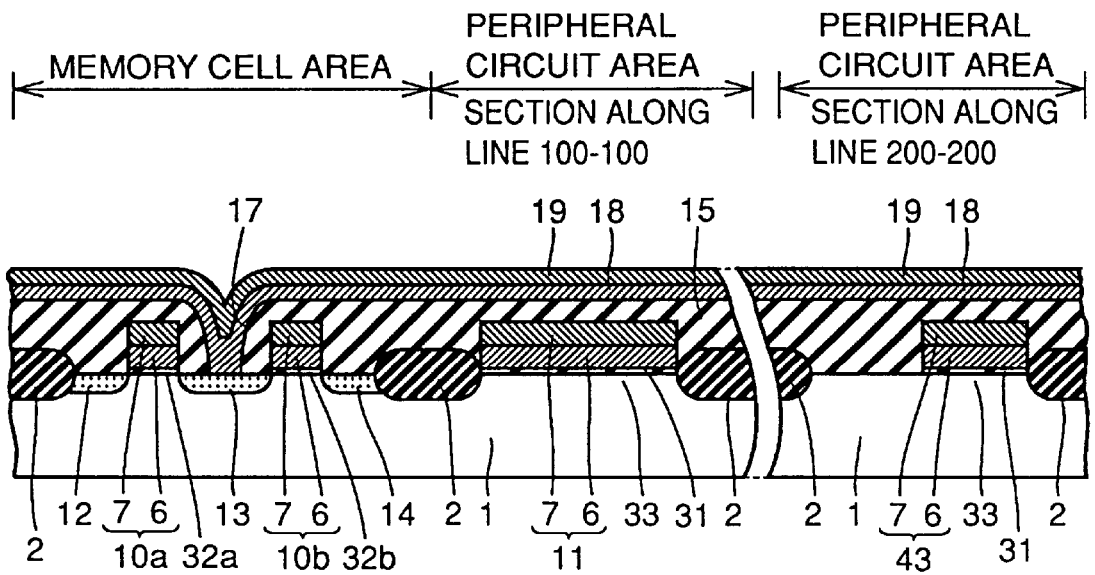
Figure 12:
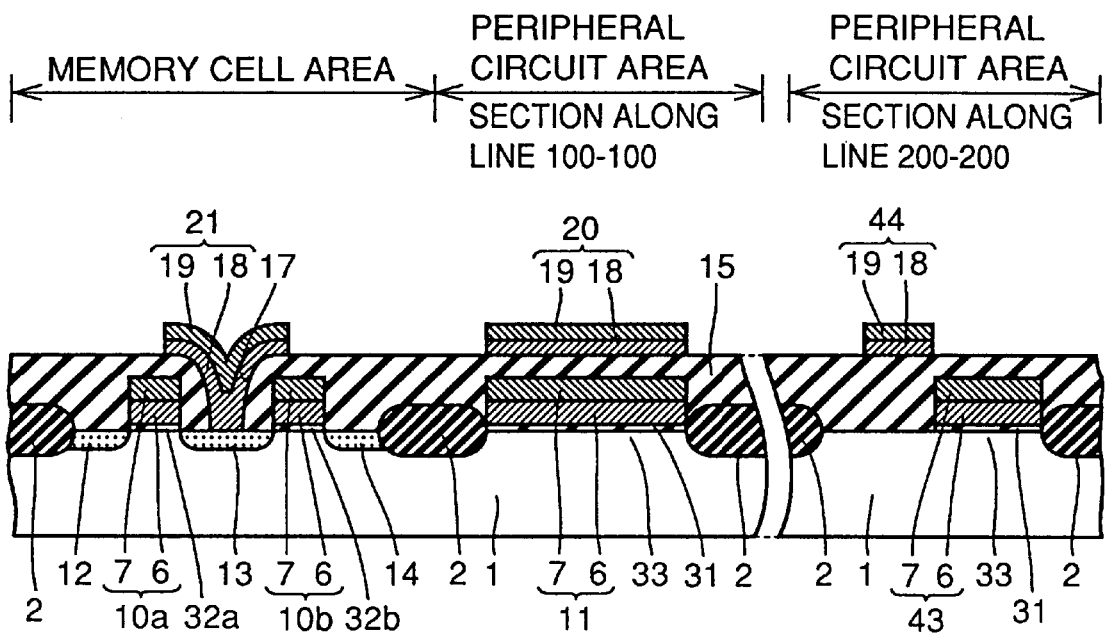
Figure 13:
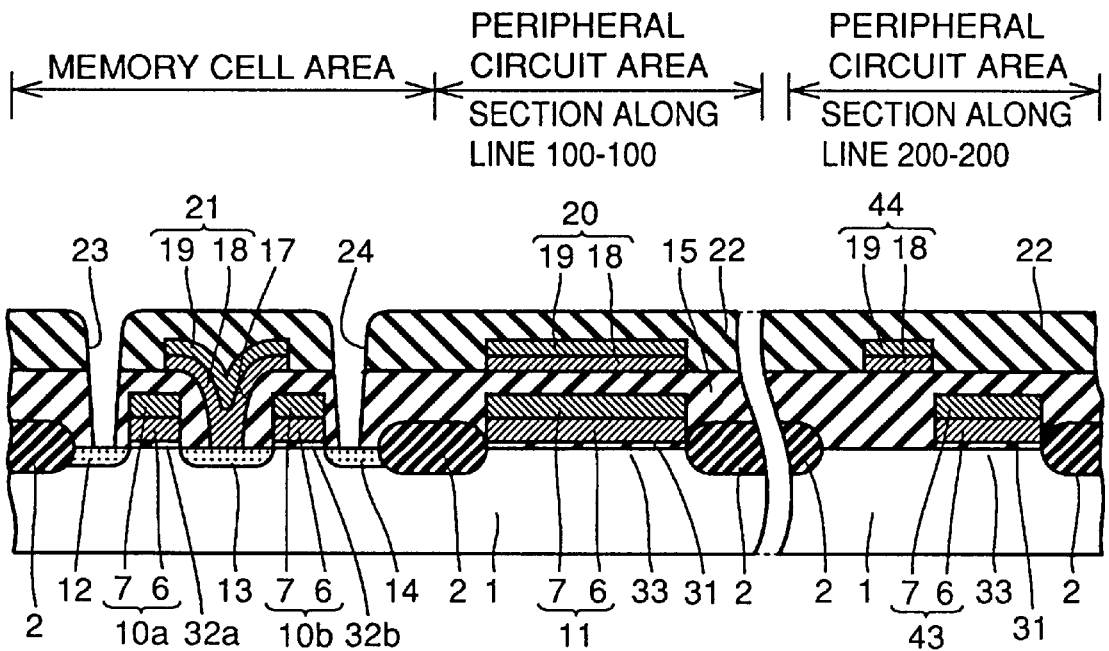
Figure 14:
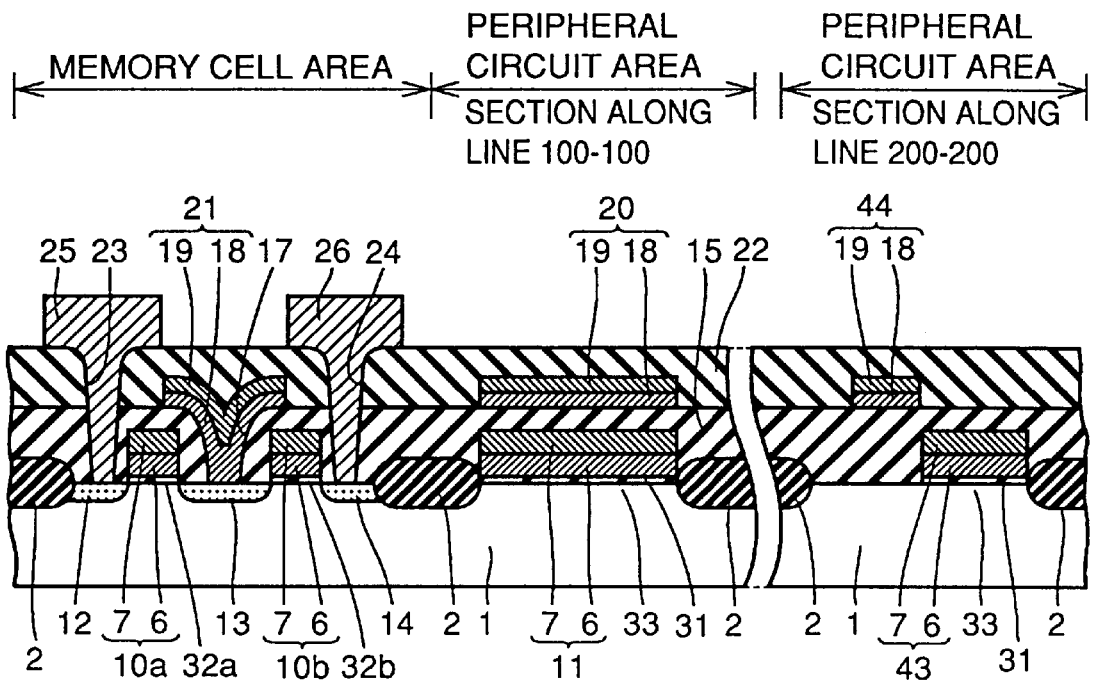

As shown in FIG. 11, a polysilicon film 18 is formed in the opening 17 and on the first interlayer isolation film 15. A tungsten silicide film 19 is formed on the polysilicon film 18.

Then, resist patterns (not shown) are formed on the tungsten silicide film 19. The polysilicon film 18 and the tungsten silicide film 19 are partially removed by anisotropic etching through the resist patterns serving as masks. Thereafter the resist patterns are removed, to obtain the structure shown in FIG. 12. In the memory cell area, the polysilicon film 18 and the tungsten silicide film 19 form the bit line 21. In the section of the peripheral circuit area taken along the line 100—100, the polysilicon film 18 and the tungsten silicide film 19 form the second electrode 20 of the capacitors in the peripheral circuit area. In the section of the peripheral circuit area taken along the line 200—200, the polysilicon film 18 and the tungsten silicide film 19 form the second connecting region 44 of the second electrode 20.

Then, the second interlayer isolation film 22 (see FIG. 13) is formed on the bit line 21, the second electrode 20, the second connecting region 44 and the first interlayer isolation film 15. Resist patterns (not shown) are formed on the second interlayer isolation film 22. The first and second interlayer isolation films 15 and 22 are partially removed by anisotropic etching through the resist patterns serving as masks, to define the openings 23 and 24 (see FIG. 13). Thereafter the resist patterns are removed, to obtain the structure shown in FIG. 13.

Then, a polysilicon film (not shown) is formed in the openings 23 and 24 and on the second interlayer isolation film 22. Resist patterns (not shown) are formed on the polysilicon film. The polysilicon film is partially removed by etching through the resist patterns serving as masks. Thereafter the resist patterns are removed, to obtain the structure shown in FIG. 14. The lower electrodes 25 and 26 of the capacitors, consisting of polysilicon, in the memory cell area are formed in the openings 23 and 24 and on the second interlayer isolation film 22.

Figure 15:
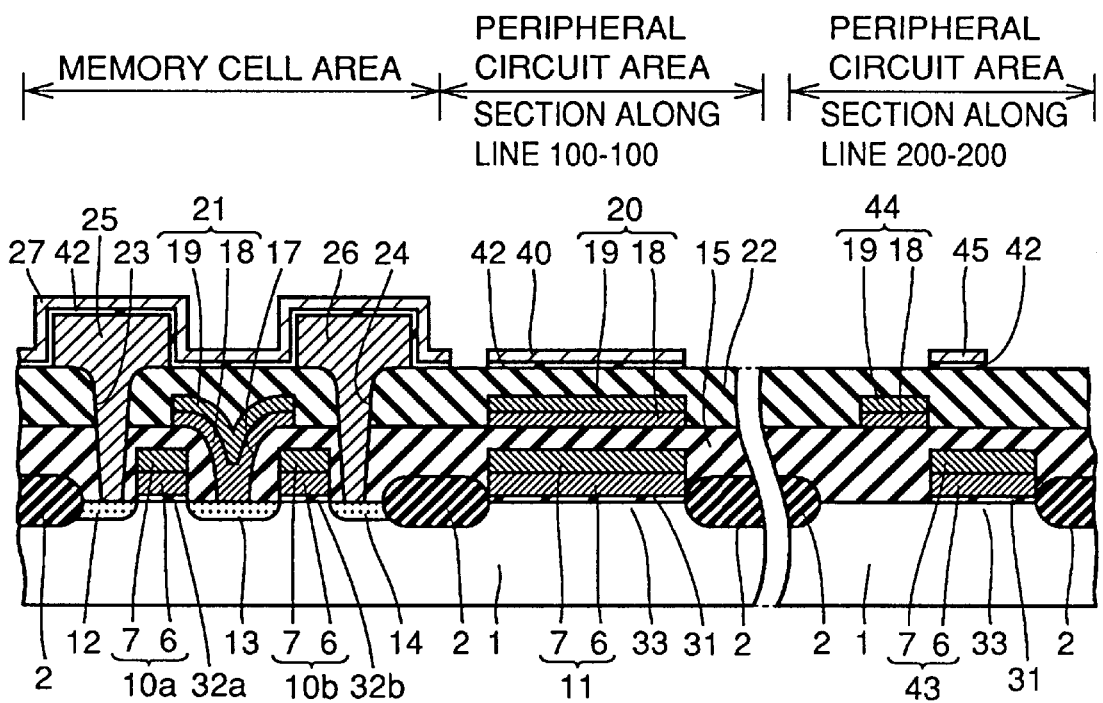

Then, an oxide film 42 (see FIG. 15) is formed on the lower electrodes 25 and 26 of the capacitors and the second interlayer isolation film 22. A polysilicon film (not shown) is formed on the oxide film 42. Resist patterns (not shown) are formed on the polysilicon film. The polysilicon film and the oxide film 42 are partially removed by anisotropic etching through the resist patterns serving as masks. Thus, the structure shown in FIG. 15 is obtained. The dielectric film consisting of the oxide film 42 and the upper electrode 27 consisting of polysilicon are formed in the memory cell area for the capacitors. The third electrode 40 and the third connecting region 45 of the capacitors are formed in the peripheral circuit area.

Thus, the first and second interlayer isolation films 15 and 22 are utilized as the dielectric films of the capacitors in the peripheral circuit area, according to the embodiment 1 of the present invention. Therefore, when the memory cell area is provided with elements such as the field-effect transistors and the capacitors through the first and second interlayer isolation films 15 and 22, for example, the electrodes 11, 20 etc. of the capacitors in the peripheral circuit area can be formed by the polysilicon films 6 and 18, the tungsten silicide films 7 and 19 and the like for forming the gate electrodes 10a and 10b etc. of these elements. Thus, the steps of forming the capacitors in the peripheral circuit area can be carried out simultaneously with those for forming the elements in the memory cell area. Consequently, it is possible to prevent the number of fabrication steps from being increased due to formation of the capacitors in the peripheral circuit area.

The second connecting region 44 of the capacitors in the peripheral circuit area is arranged not to planarly overlap with the first electrode 11, whereby the opening 38 (see FIG. 1) can be prevented from coming into contact with the first electrode 11 even if the same passes through the second connecting region 44 to reach the first interlayer isolation film 15 in a step of forming the opening 38 described later. Consequently, the capacitors of the peripheral circuit area can be prevented from losing functions thereof due to undesirable connection between the second electrode 20 and the first electrode 11.

Figure 16:
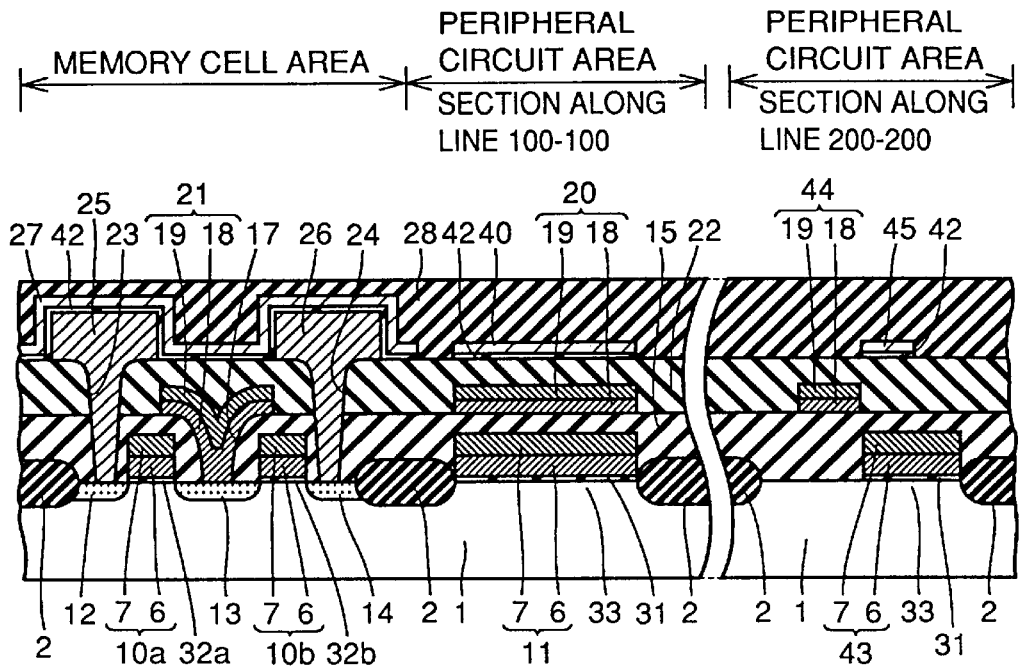

After the step shown in FIG. 15, the third interlayer isolation film 28 is formed to cover the overall surfaces of the memory cell area and the peripheral circuit area, as shown in FIG. 16.

Figure 17:
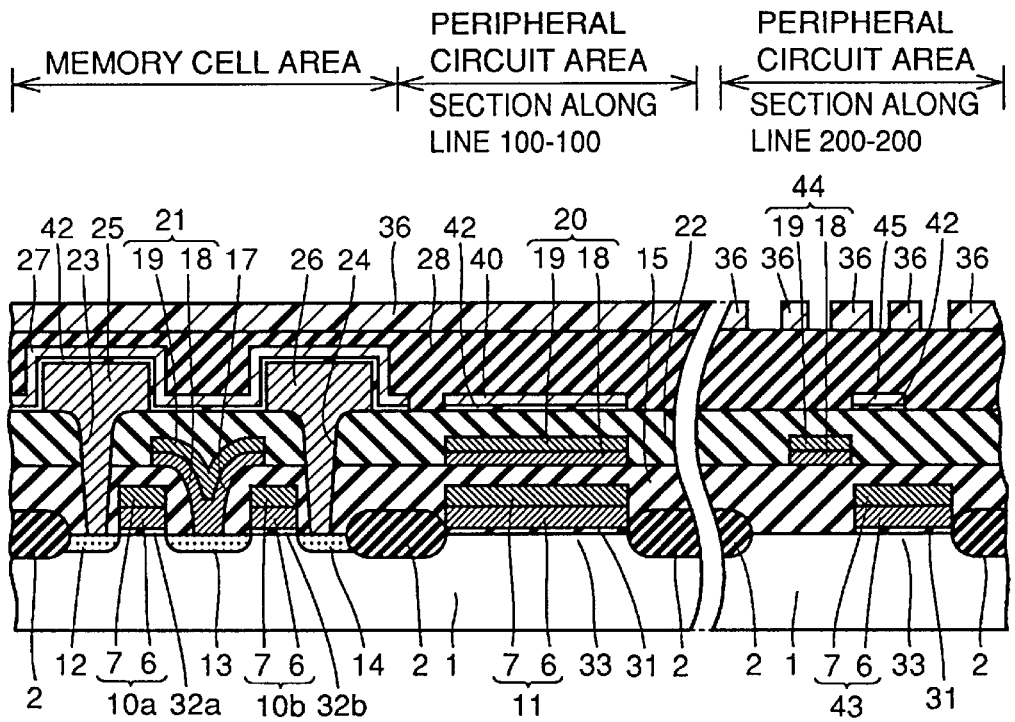

Then, resist patterns 36 are formed on the third interlayer isolation film 28, as shown in FIG. 17.

Figure 18:
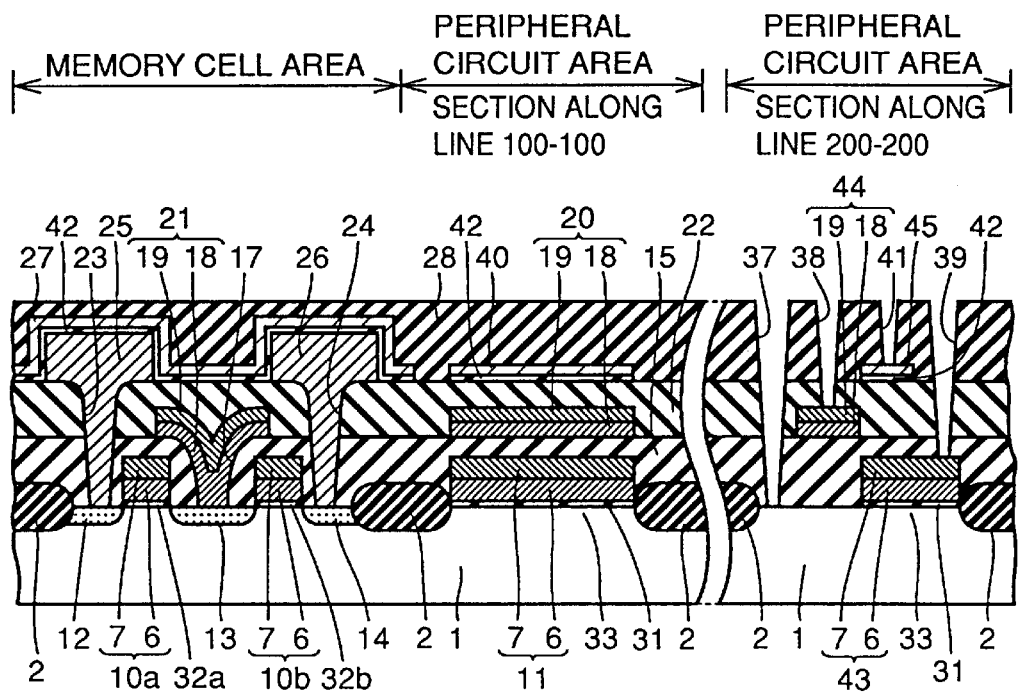

Then, the first to third interlayer isolation films 15, 22 and 28 are partially removed through the resist patterns 36 serving as masks, to define the openings 37, 38, 41 and, 39 (see FIG. 18). Thereafter the resist patterns 36 are removed, to obtain the structure shown in FIG. 18.

Figure 19:
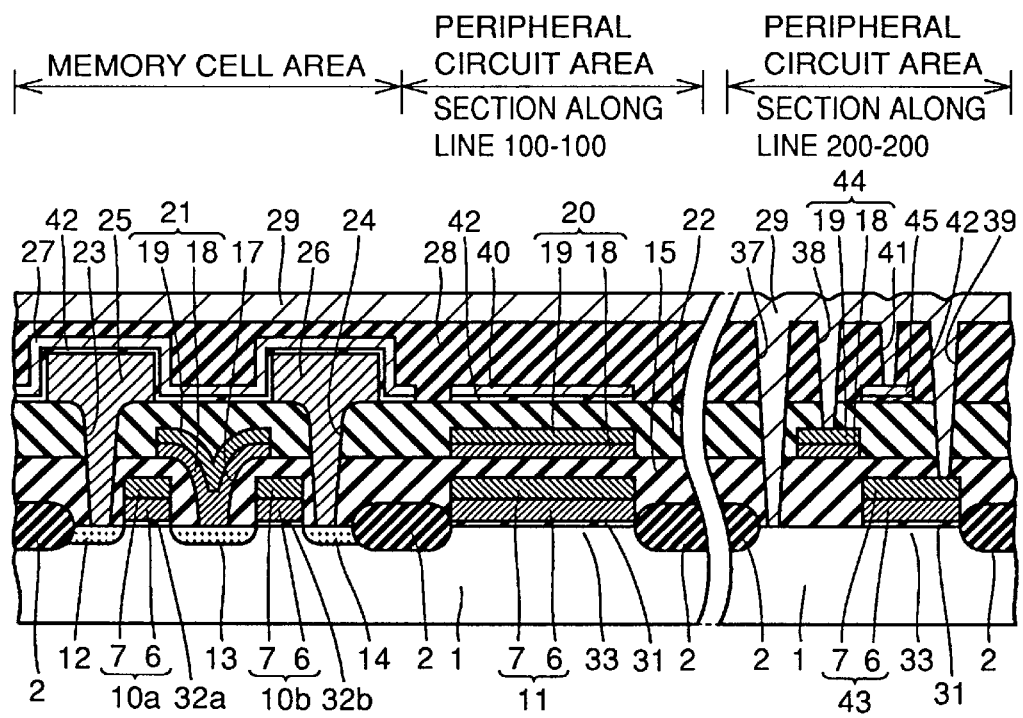

Then, a metal layer 29 is formed in the openings 37, 38, 41 and 39 and on the third interlayer isolation film 28, as shown in FIG. 19. Then, resist patterns (not shown) are formed on the metal layer 29. The metal layer 29 is partially removed by etching through the resist patterns serving as masks, to obtain the semiconductor device shown in FIG. 1. The metal wires 34 and 35 (see FIG. 1) connect the first and third electrodes 11 and 40 of the capacitors in the peripheral circuit area and the conductive region 33 on the major surface of the semiconductor substrate 1 and the second electrode 20 through the openings 37, 38, 41 and 39. Thus, the plurality of capacitors can be connected in parallel with each other as shown in FIG. 3. Even if the areas of the electrodes 11, 20 and 40 of the capacitors in the peripheral circuit area are reduced, therefore, it is possible to ensure necessary capacitances by connecting the plurality of capacitors in parallel with each other. Consequently, the occupied areas of the capacitors can be reduced while ensuring constant capacitances required for the capacitors in the peripheral circuit area.

(Embodiment 2)

Figures 20, 21:
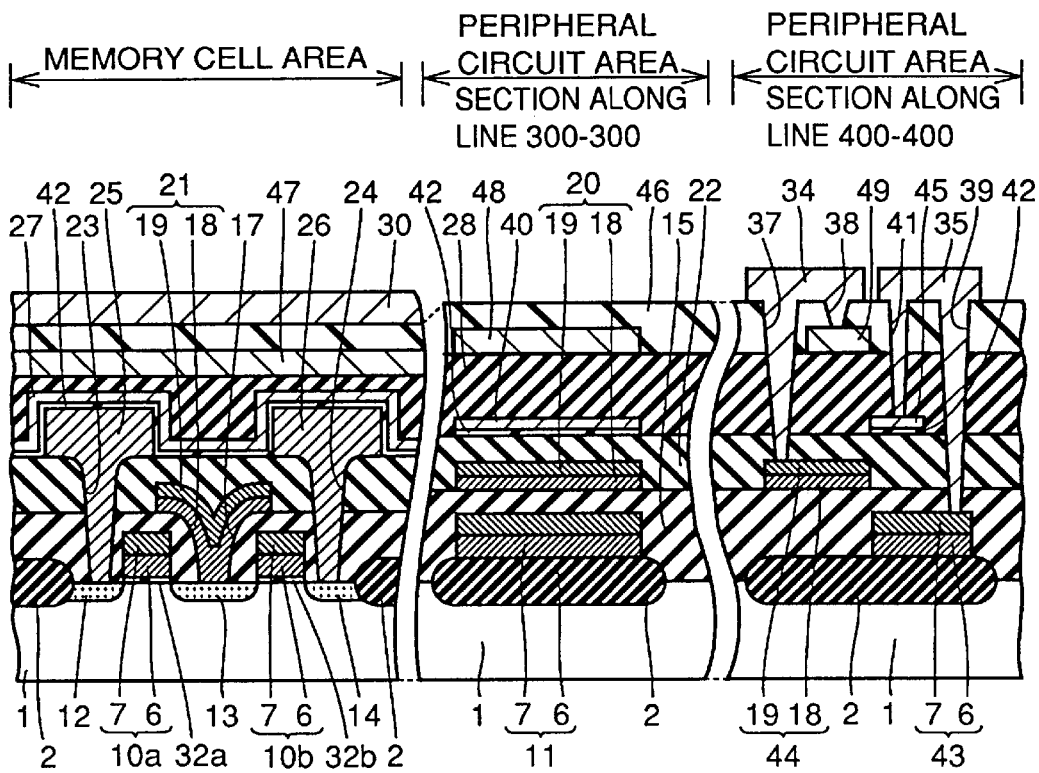
FIG. 20 is a sectional view showing a semiconductor device according to an embodiment 2 of the present invention.
FIG. 21 is a plan view typically showing the structure of capacitors in a peripheral circuit area of the semiconductor device according to the embodiment 2 shown in FIG. 20.

With reference to FIG. 20, a semiconductor device according to an embodiment 2 of the present invention is now described.

The semiconductor device according to the embodiment 2 of the present invention shown in FIG. 20 is basically similar in structure to the semiconductor device according to the embodiment 1 shown in FIG. 1. However, this semiconductor device further comprises a fourth interlayer solation film 46 on a metal wire 47 which is formed on a third interlayer isolation film 28 in a memory cell area. A second metal wire 30 is formed on the fourth interlayer isolation film 46.

In a peripheral circuit area, capacitors are formed on a field oxide film 2. Sections of the peripheral circuit area taken along the lines 300—300 and 400—400 in FIG. 21 correspond to those of the embodiment 1 shown in FIG. 1 taken along the lines 100—100 and 200—200 respectively. The positional relation between the lines 300—300 and 400—400 is now described with reference to FIG. 21. Referring to FIG. 21, the line 300—300 is located on a portion of electrodes of the capacitors. The line 400—400 is located on a portion provided with openings 37, 38, 41 and 39.

Referring again to FIG. 20, a fourth electrode 48 is formed on the third interlayer isolation film 28 in the section of the peripheral circuit area taken along the line 300—300. The fourth interlayer isolation film 46 is formed on the fourth electrode 48 and the third interlayer isolation film 28. In the section of the peripheral circuit area taken along the line 400—400, a fourth connecting region 49 is formed on the third interlayer isolation film 28. The fourth interlayer isolation film 46 is formed on the fourth connecting region 49 and the third interlayer isolation film 28. A metal wire 35 connects first and third connecting regions 43 and 45 with each other through the openings 41 and 39. Another metal wire 34 connects a second connecting region 44 and the fourth connecting region 49 with each other through the openings 37 and 38.

Figure 22:
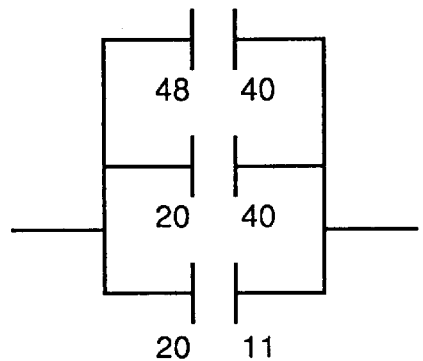
FIG. 22 is an equivalent circuit diagram of the capacitors formed in the peripheral circuit area of the semiconductor device according to the embodiment 2 shown in FIG. 20.

Due to the aforementioned structure, a plurality of capacitors can be formed in the peripheral circuit area. In more concrete terms, a lower electrode consisting of a first electrode 11, a dielectric film consisting of a first interlayer isolation film 15 and an upper electrode consisting of a second electrode 20 form a first capacitor. A lower electrode consisting of the second electrode 20, a dielectric film consisting of a second interlayer isolation film 22 and an upper electrode consisting of a third electrode 40 form a second capacitor. A lower electrode consisting of the third electrode 40, a dielectric film consisting of the third interlayer isolation film 28 and an upper electrode consisting of the fourth electrode 48 form a third capacitor. The metal wires 34 and 35 connect these electrodes with each other, whereby the first to third capacitors can be connected in parallel with each other as shown in FIG. 22.

Thus, the first to third interlayer isolation films 15, 22 and 28 are utilized as the dielectric films of the capacitors in the peripheral circuit area in the semiconductor according to the embodiment 2 of the present invention, similarly to the embodiment 1. Therefore, when the memory cell area is provided with elements such as field-effect transistors and capacitors through the first to third interlayer isolation films 15, 22 and 28, for example, the electrodes 11, 20, 40 and 48 of the capacitors in the peripheral circuit area can be formed by polysilicon films 6 and 18, tungsten silicide films 7 and 19 and the like for forming gate electrodes etc. of these elements. Thus, steps of forming the capacitors in the peripheral circuit area can be carried out simultaneously with those for forming the elements in the memory cell area. Consequently, it is possible to prevent the number of fabrication steps from being increased due to formation of the capacitors in the peripheral circuit area.

Further, the first to fourth electrodes 11, 20, 40 and 48 are stacked with each other through the dielectric films consisting of the first to third interlayer isolation films 15, 22 and 28, and the first and second electrodes 11 and 20 are connected with the third and fourth electrodes 40 and 48 by the metal wires 34 and 35 respectively. Thus, the first capacitor formed by the first electrode 11, the dielectric film consisting of the first interlayer isolation film 15 and the second electrode 20, the second capacitor formed by the second electrode 20, the dielectric film consisting of the second interlayer isolation film 22 and the third electrode 40 and the third capacitor formed by the third electrode 40, the dielectric film consisting of the third interlayer isolation film 28 and the fourth electrode 48 are connected in parallel with each other. Even if the areas of the electrodes 11, 20, 40 and 48 of the capacitors are reduced to reduce the occupied areas of the capacitors, therefore, it is possible to ensure necessary capacitances by connecting the plurality of capacitors in parallel with each other. Consequently, the occupied areas of the capacitors can be reduced while ensuring constant capacitances required for the capacitors in the peripheral circuit area, without increasing the number of steps of fabricating the semiconductor device.

The second connecting region 44 is arranged not to planarly overlap with the first electrode 11, whereby the first capacitor formed by the first electrode 11, the first interlayer isolation film 15 and the second electrode 20 is prevented from losing its function due to undesirable connection between the opening 37 and the first electrode 11 even if the opening 37 passes through the second connecting region 44 to reach the first interlayer isolation film 15 in a step of forming the same. Consequently, it is possible to obtain a semiconductor device comprising highly reliable capacitors in its peripheral circuit area.

With reference to FIGS. 23 to 40, steps of fabricating the semiconductor device according to the embodiment 2 of the present invention are now described.

Figure 23:
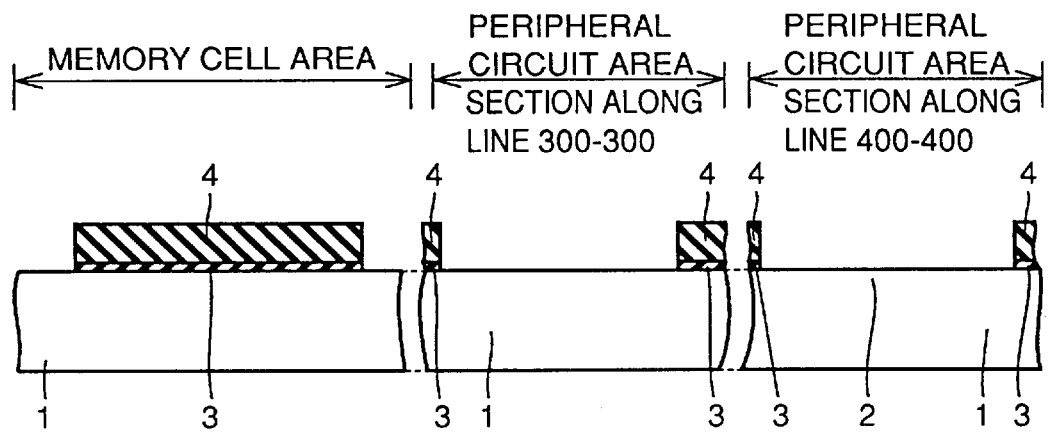
FIGS. 23 to 40 are sectional views for illustrating first to eighteenth steps of fabricating the semiconductor device according to the embodiment 2 shown in FIG. 20.
Figure 24:
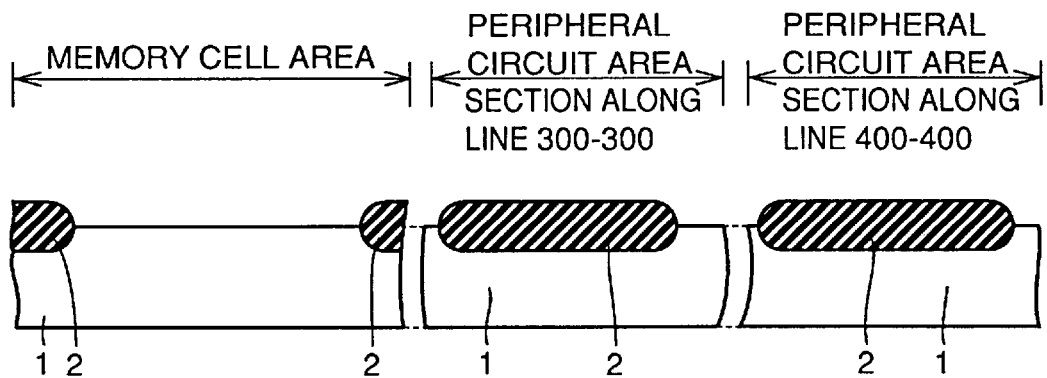

The fabrication steps shown in FIGS. 23 and 24 are substantially identical to those shown in FIGS. 4 and 5 for the semiconductor device according to the embodiment 1.

Figure 7:
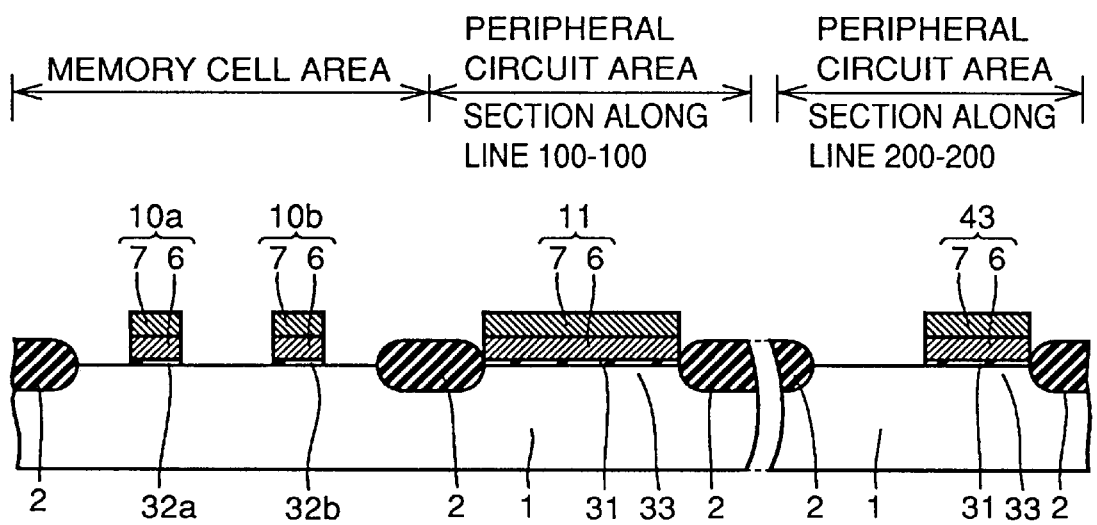
Figure 25:
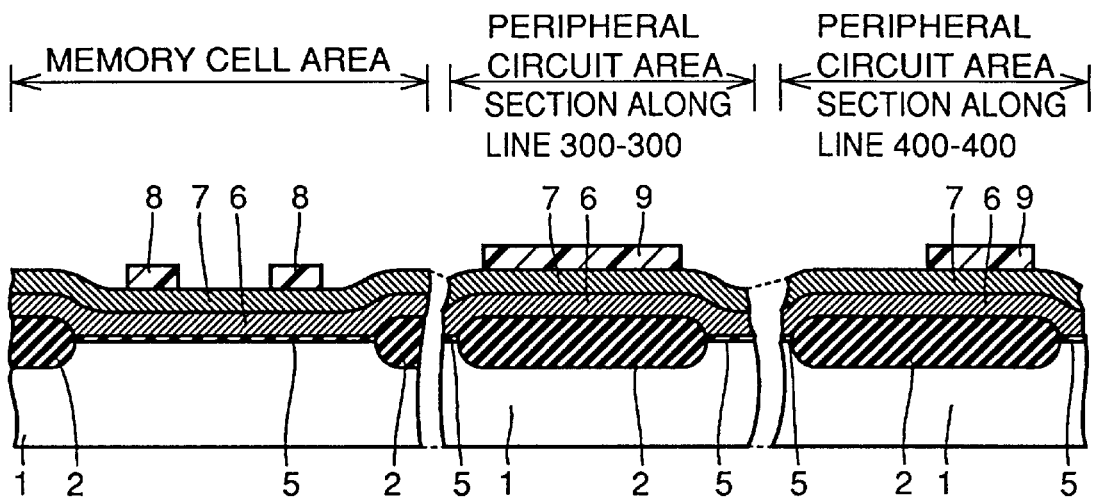
Figure 26:
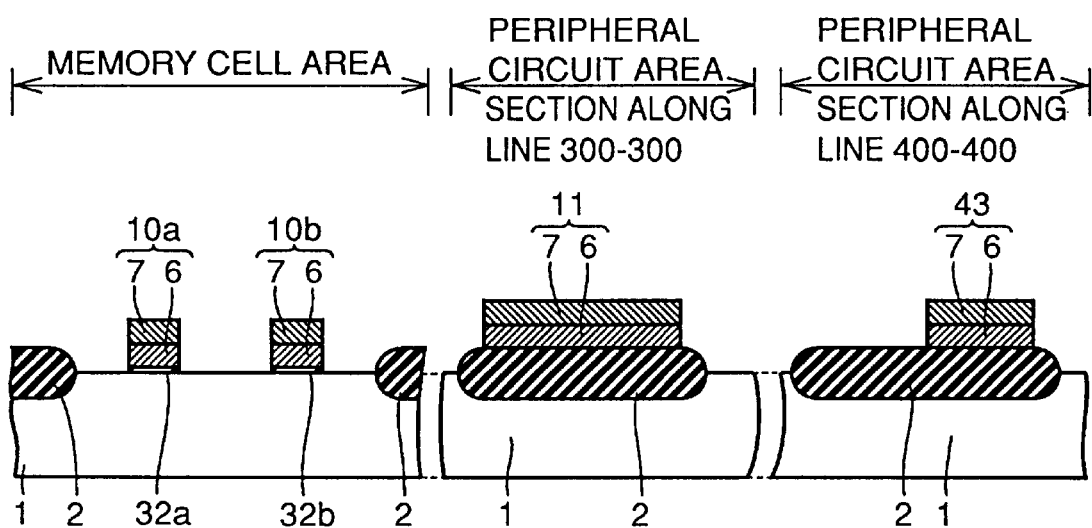
Figure 27:
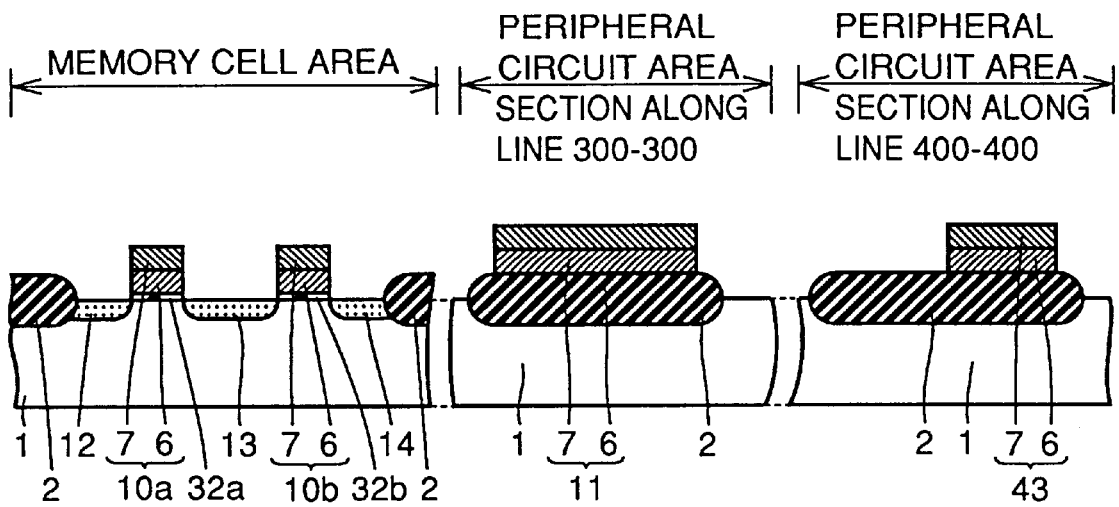
Figure 28:
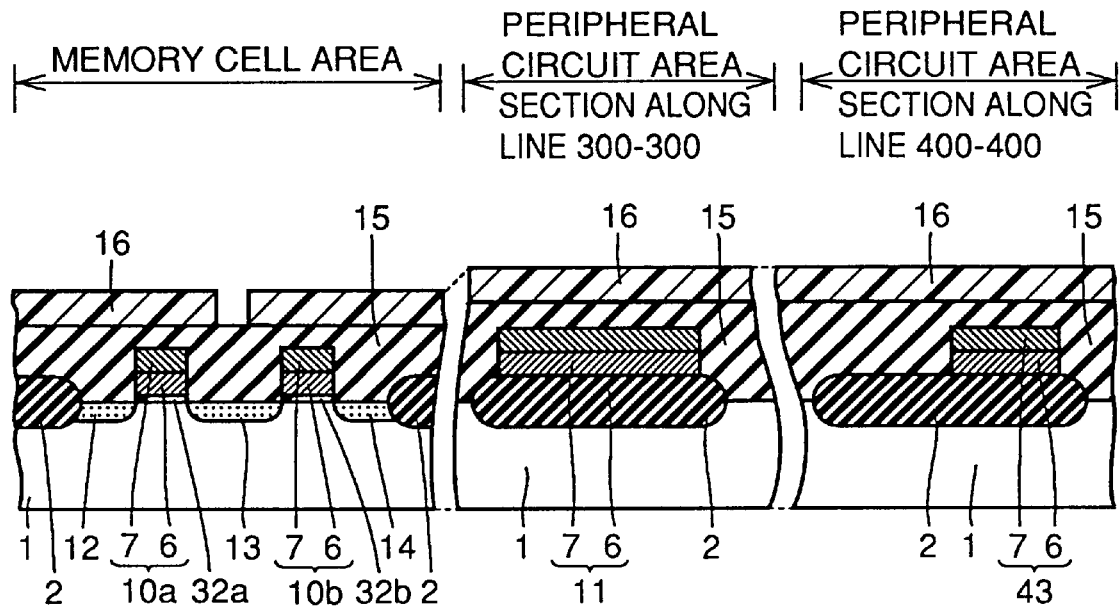
Figure 29:
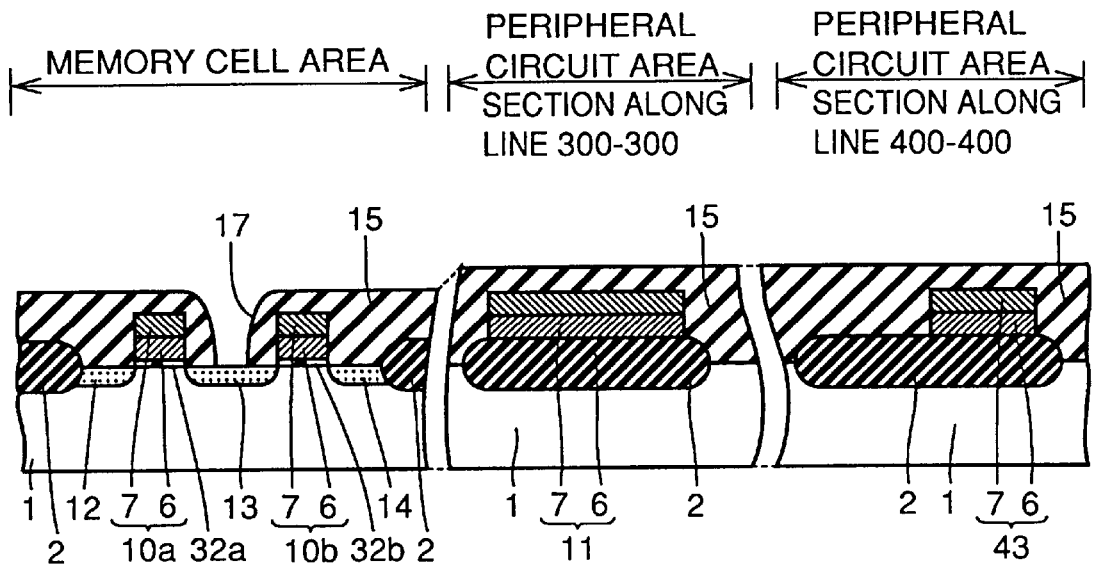
Figure 30:
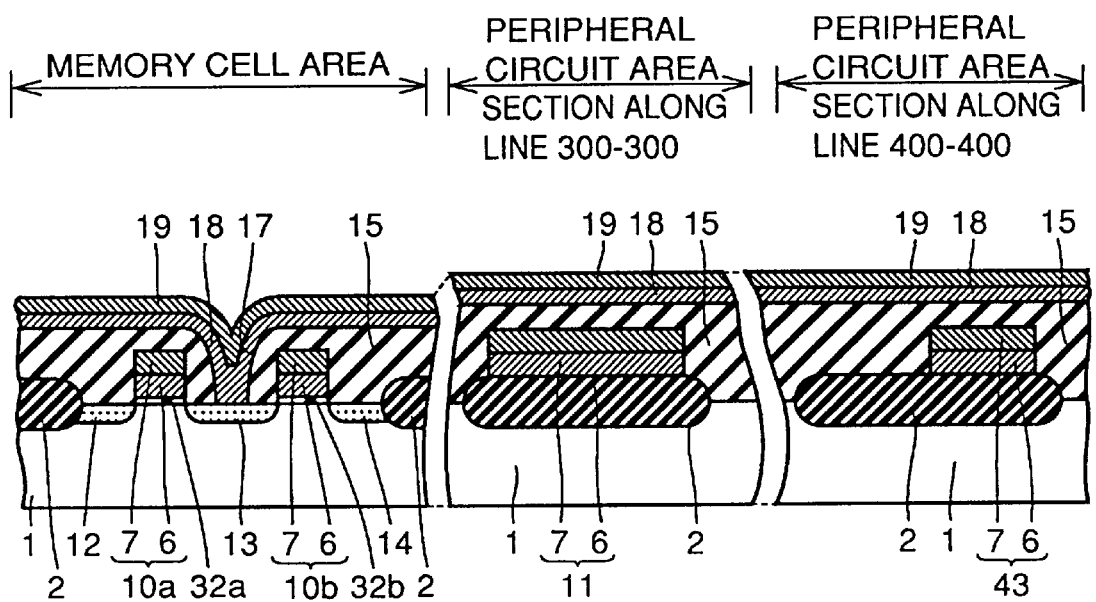
Figure 31:
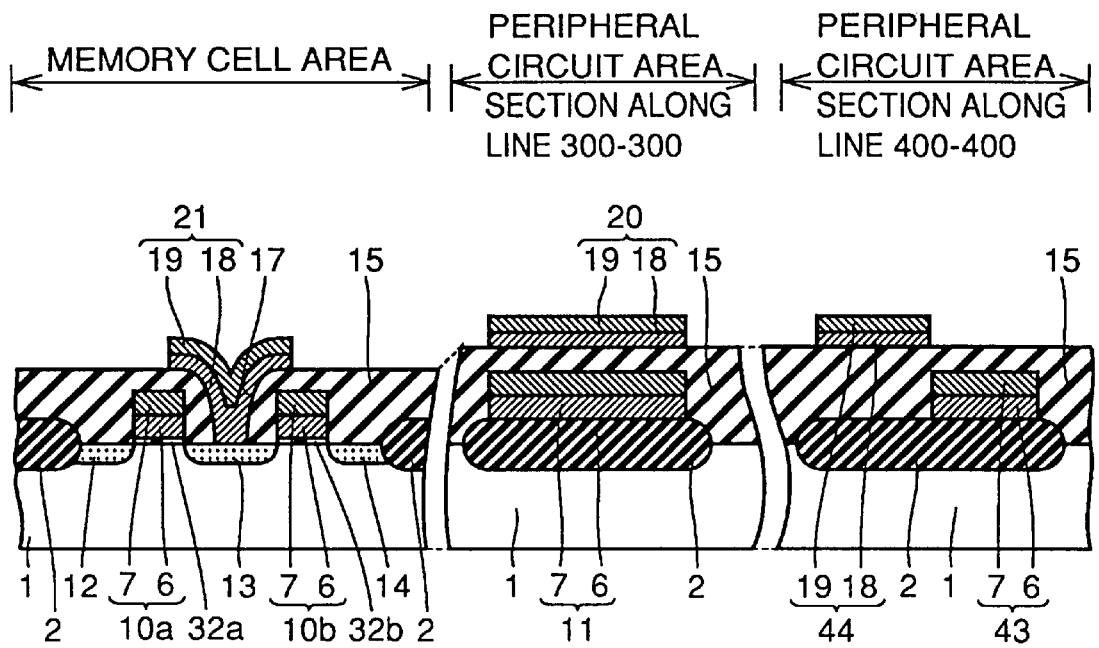
Figure 32:
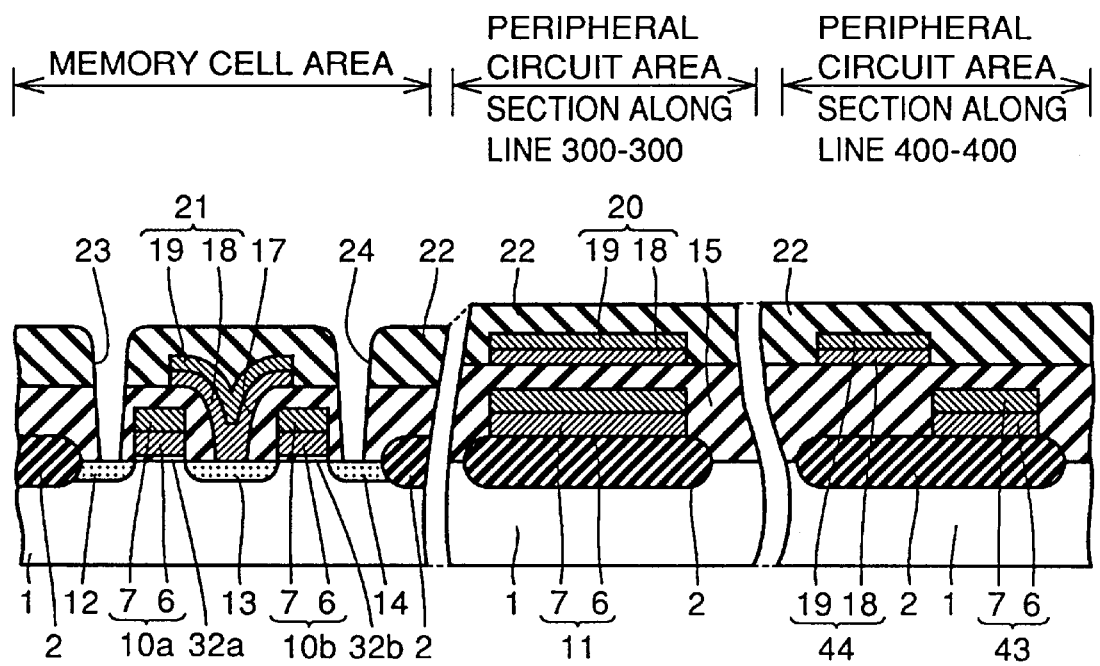
Figure 33:
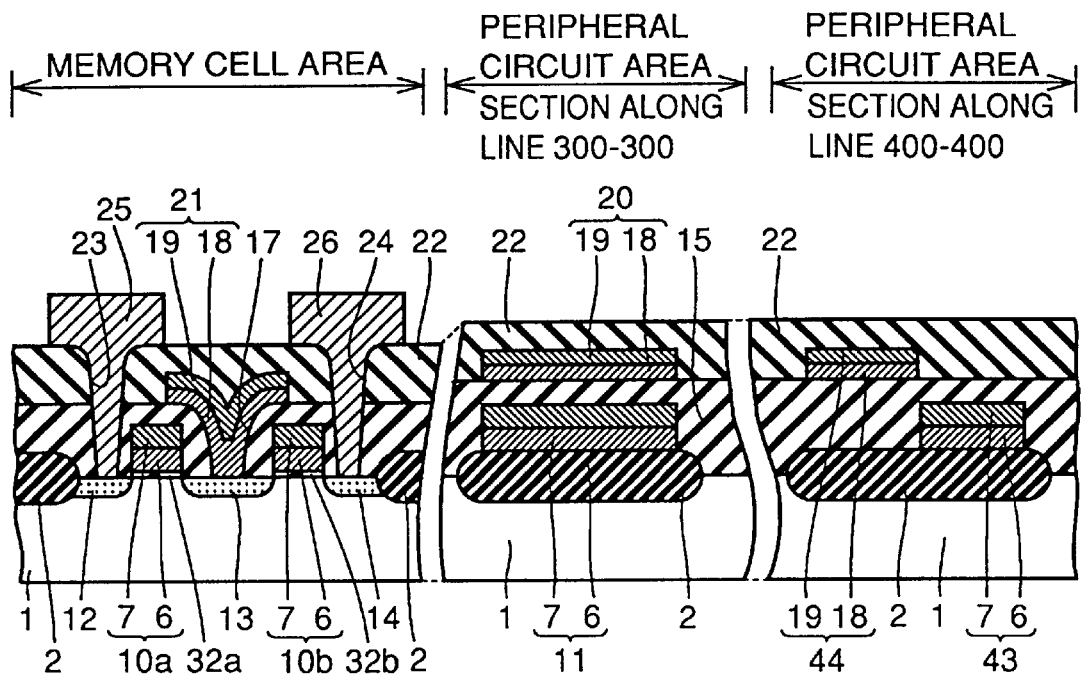

The fabrication steps shown in FIGS. 25 and 26 are substantially identical to those shown in FIGS. 6 and 7 for the semiconductor device according to the embodiment 1. According to the embodiment 2 of the present invention, however, a resist pattern 9 provided on a tungsten silicide film 7 is located above the field oxide film 2 in the peripheral circuit area, as shown in FIG. 25. Therefore, the first electrode 11 and the first connecting region 43 of the capacitors in the peripheral circuit area are formed on the field oxide film 2, as shown in FIG. 26.

The fabrication steps shown in FIGS. 27 to 35 are substantially identical to those shown in FIGS. 8 to 16 for the semiconductor device according to the embodiment 1.

Figure 34:
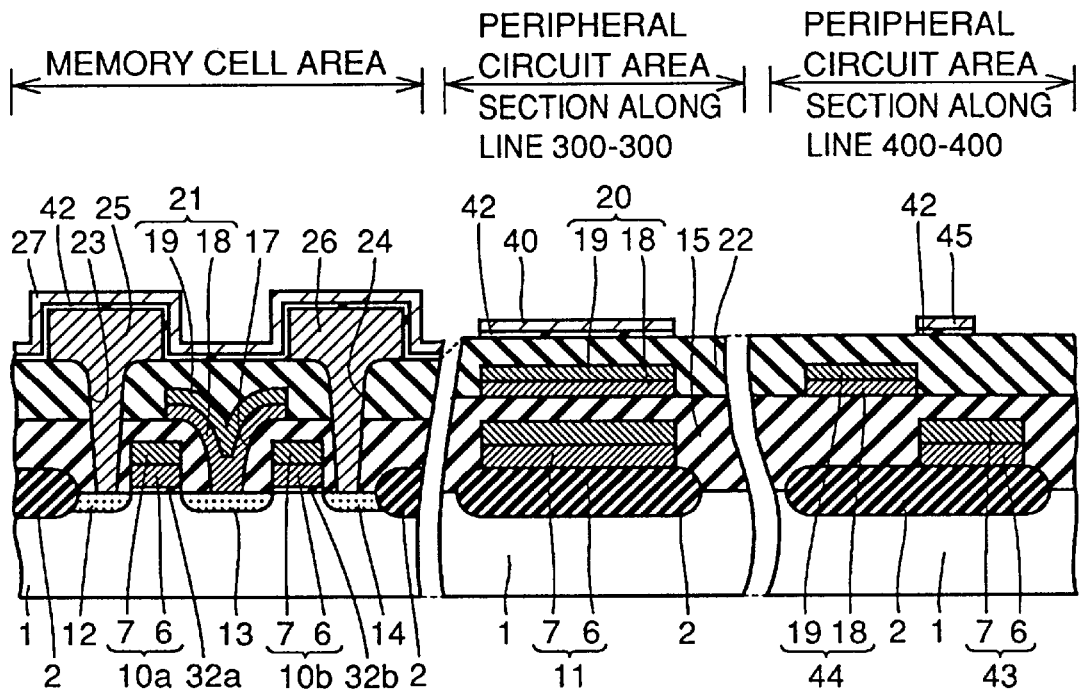

The second connecting region 44 is arranged not to planarly overlap with the first electrode 11 as shown in FIG. 34, whereby the opening 37 (see FIG. 20) can be prevented from coming into contact with the first electrode 11 even if the opening 37 passes through the second connecting region 44 to reach the first interlayer isolation film 15 in a step of forming the same. Therefore, the first capacitor formed by the first electrode 11, the dielectric film consisting of the first interlayer isolation film 15 and the second electrode 20 can be prevented from losing its function due to undesirable connection between the second electrode 20 and the first electrode 11 by the metal wire 34 (see FIG. 20) through the opening 37. Further, the third connecting region 45 is arranged to planarly overlap with the first electrode 11, whereby the first and third electrodes 11 and 40 are at the same potentials as shown in FIG. 22 and hence the capacitors in the peripheral circuit area are prevented from losing the functions thereof even if the opening 41 (see FIG. 20) passes through the third connecting region 45 to reach the first electrode 11 in the step of forming the same. Consequently, it is possible to obtain a semiconductor device comprising highly reliable capacitors in its peripheral circuit area.

Figure 35:
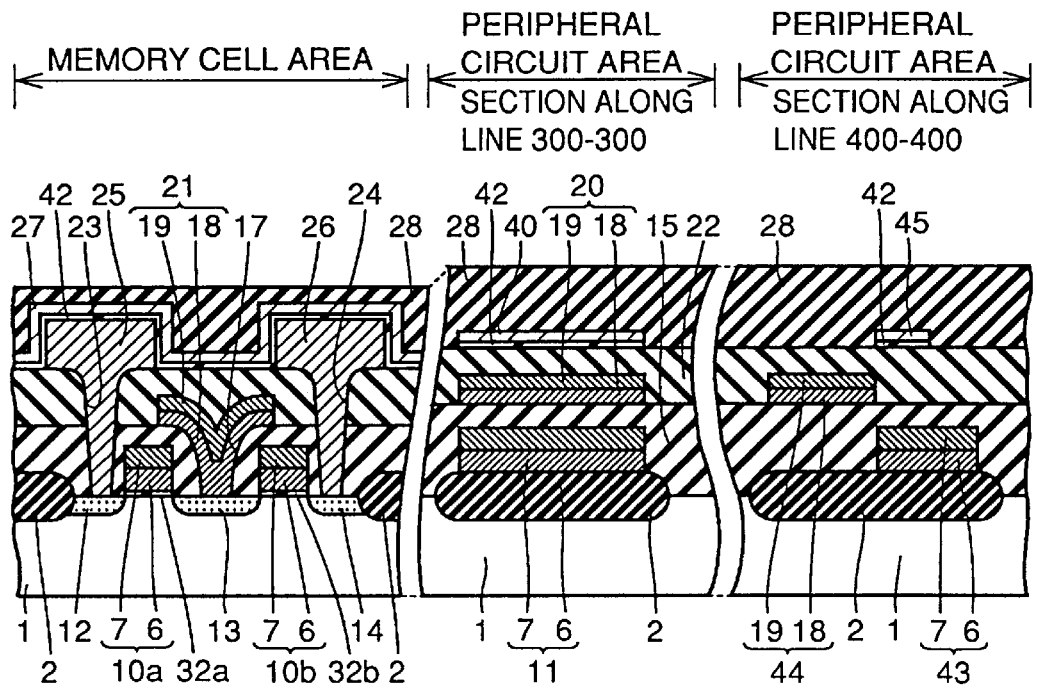
Figure 36:
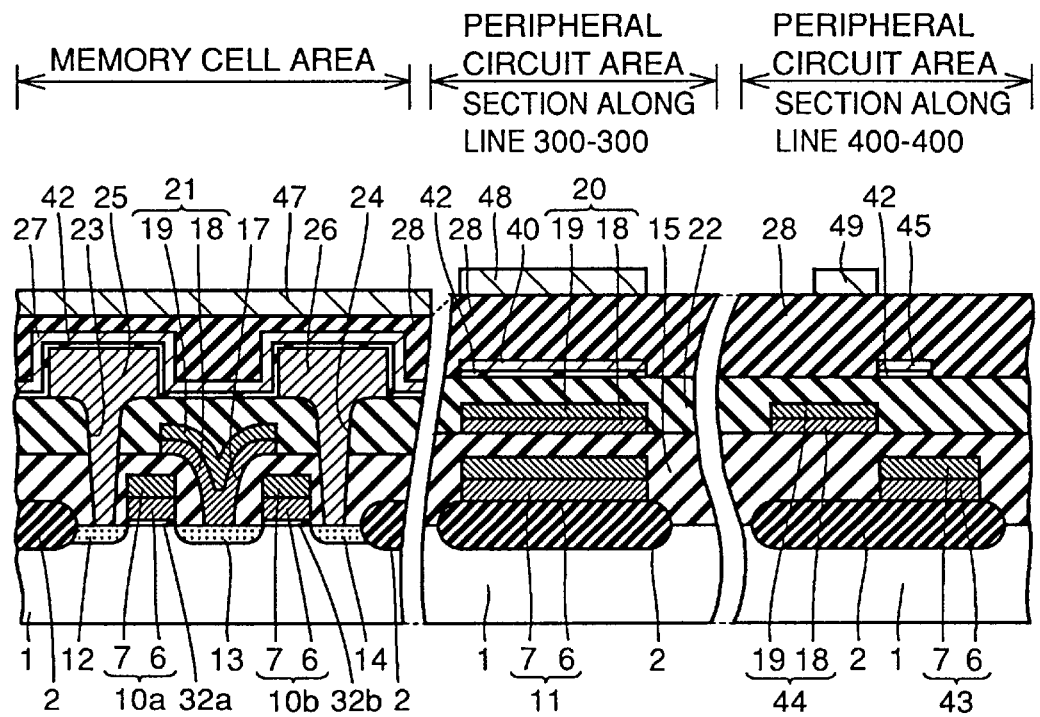

After the step shown in FIG. 35, a metal layer (not shown) is formed on the third interlayer isolation film 28. Resist patterns (not shown) are formed on the metal layer. The metal layer is partially removed by anisotropic etching through the resist patterns serving as masks, to form the metal wire 47 in the memory cell area and the fourth electrode 48 and the fourth connecting region 49 in the peripheral circuit area as shown in FIG. 36.

Thus, the first to third interlayer isolation films 15, 22 and 28 are utilized as the dielectric films of the capacitors in the peripheral circuit area in the steps of fabricating the semiconductor device according to the embodiment 2 of the present invention, similarly to those for the semiconductor device according to the embodiment 1. Therefore, when the memory cell area is provided with elements such as field-effect transistors and capacitors through the first to third interlayer isolation films 15, 22 and 28, for example, the electrodes 11, 20, 40 and 48 etc. of the capacitors in the peripheral circuit area can be formed by the polysilicon films 6 and 18, the tungsten silicide films 7 and 19 and the like for forming gate electrodes etc. of these elements. Thus, steps of forming the capacitors in the peripheral circuit area can be carried out simultaneously with those for forming the elements in the memory cell area. Consequently, it is possible to prevent the number of fabrication steps from being increased due to formation of the capacitors in the peripheral circuit area.

Figure 37:
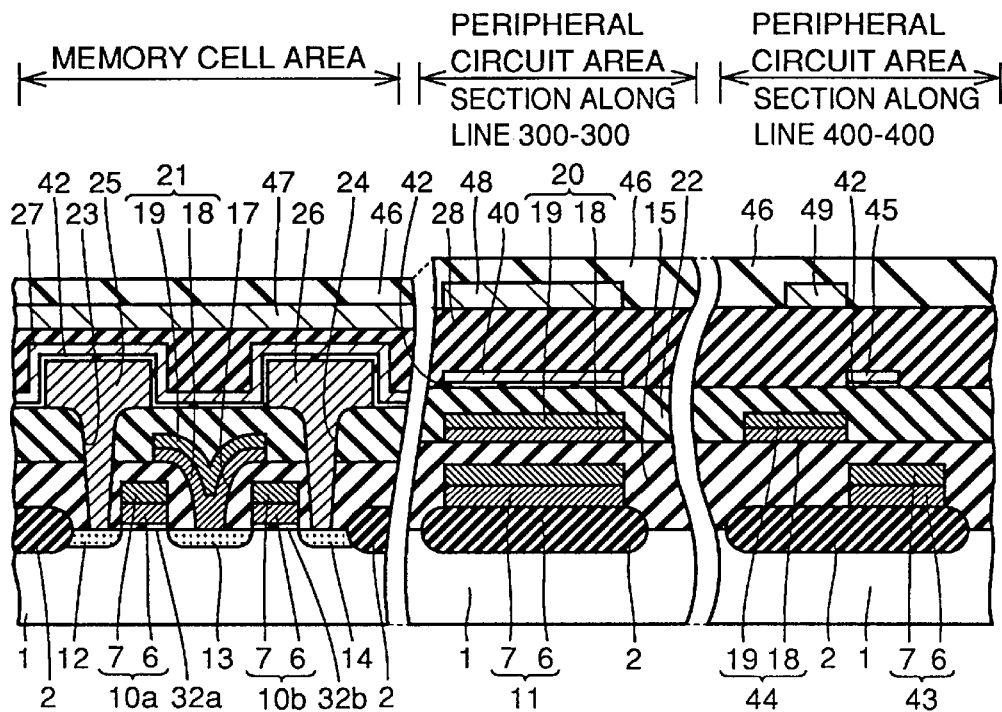

Then, the fourth interlayer isolation film 46 is formed on the metal wire 47, the fourth electrode 48, the fourth connecting region 49 and the third interlayer isolation film 28, as shown in FIG. 37.

Figure 38:
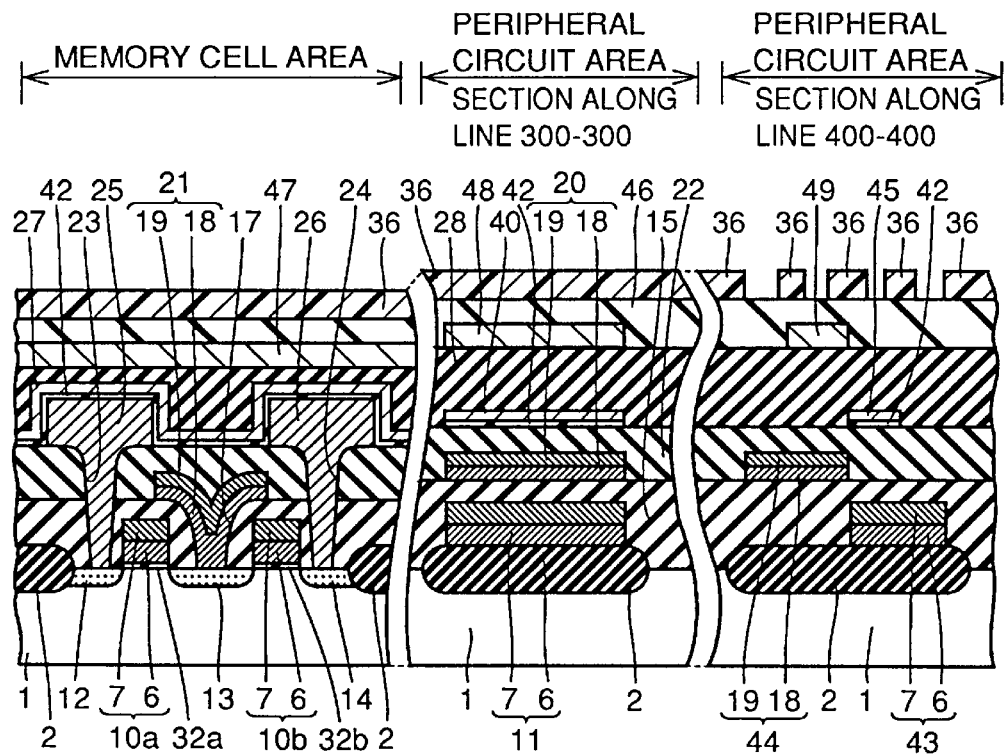

Then, resist patterns 36 are formed on the fourth interlayer isolation film 46, as shown in FIG. 38.

Figure 39:
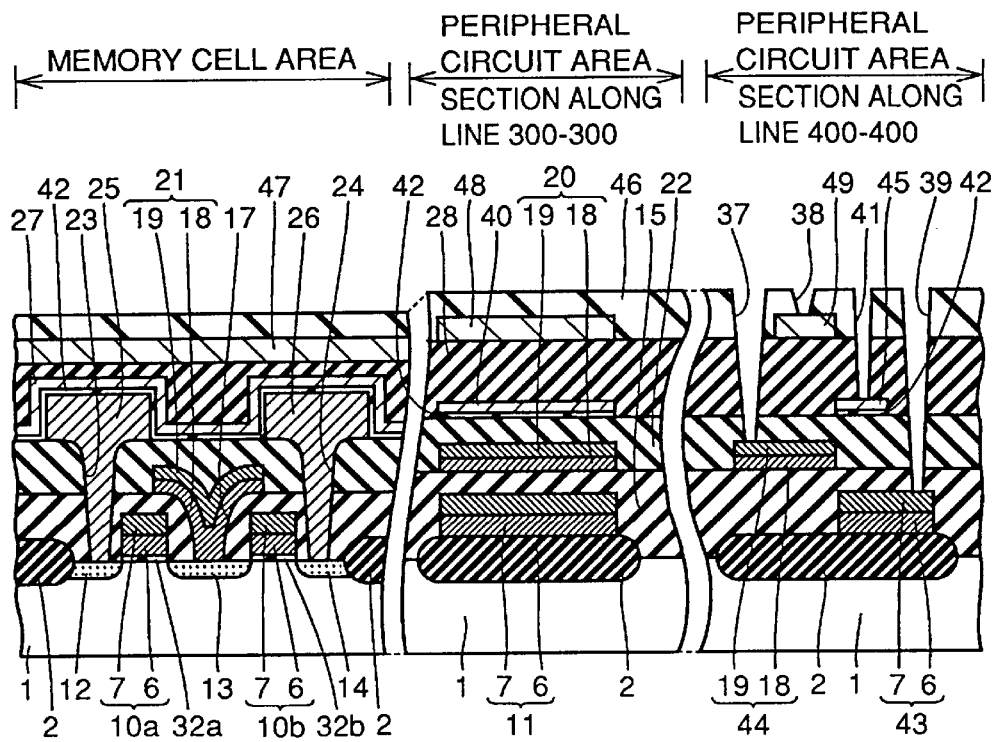

Then, the first to fourth interlayer isolation films 15, 22, 28 and 46 are partially removed by anisotropic etching through the resist patterns 36 serving as masks, to define the openings 37, 38, 41 and 39 (see FIG. 39). Thereafter the resist patterns 36 are removed, to obtain the structure shown in FIG. 39.

Figure 40:
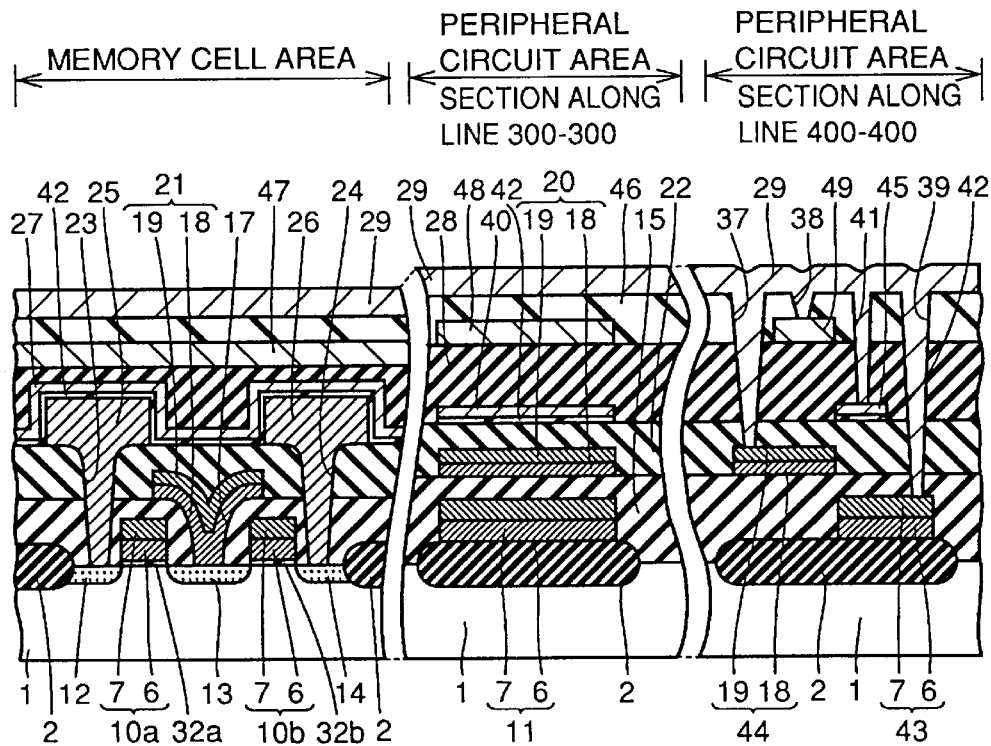
Figure 41:
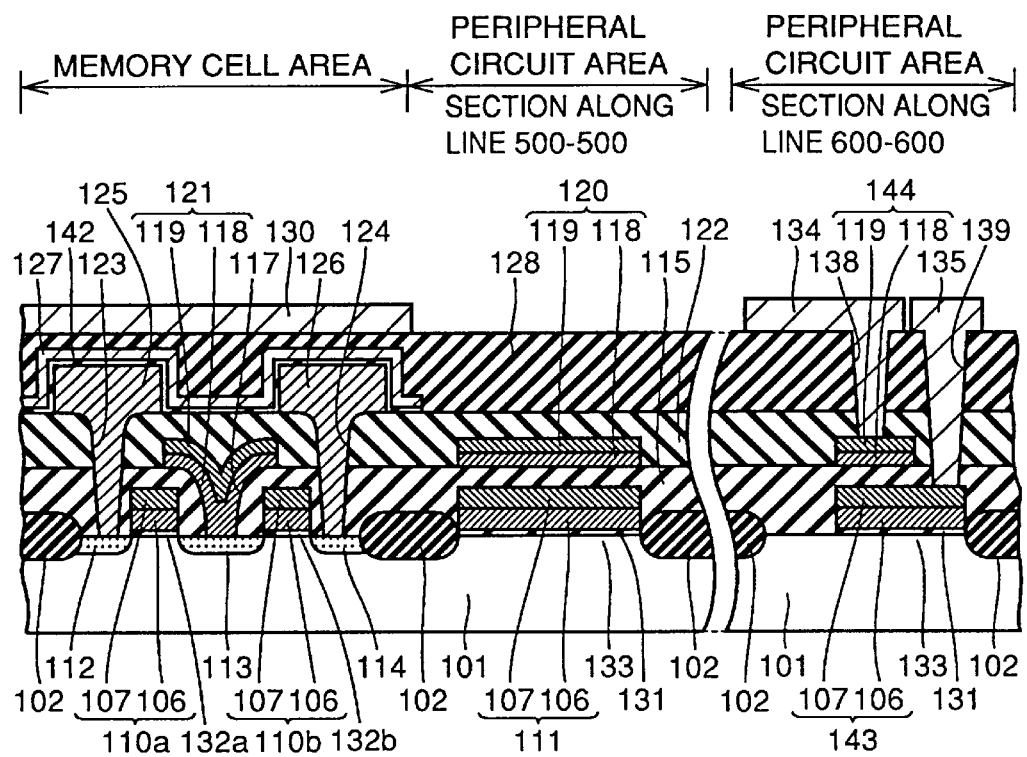
FIG. 41 is a sectional view showing a conventional semiconductor device.
Figure 42:
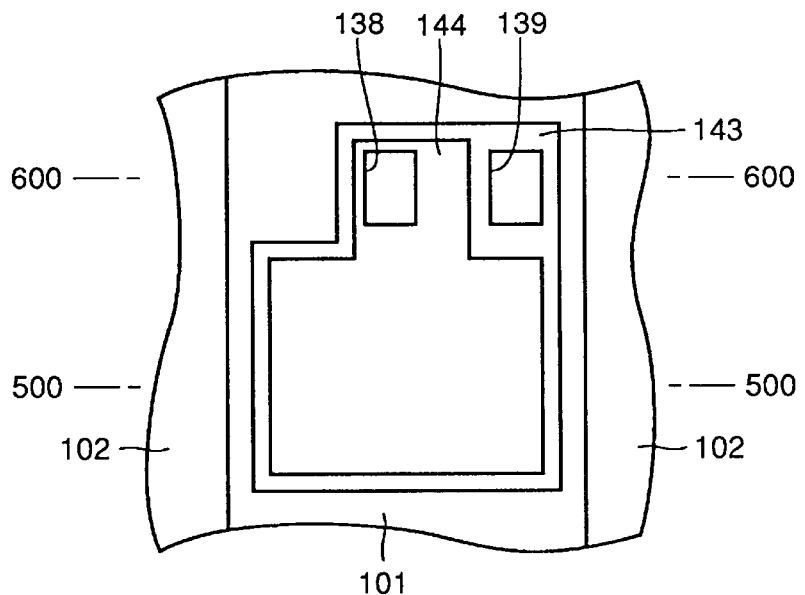
FIG. 42 is a plan view typically showing the structure of a capacitor formed in a peripheral circuit area of the conventional semiconductor device shown in FIG. 41.
Figure 43:
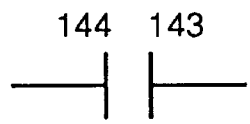
FIG. 43 is an equivalent circuit diagram of the capacitor in the peripheral circuit area of the conventional semiconductor device shown in FIG. 41.
Figure 44:
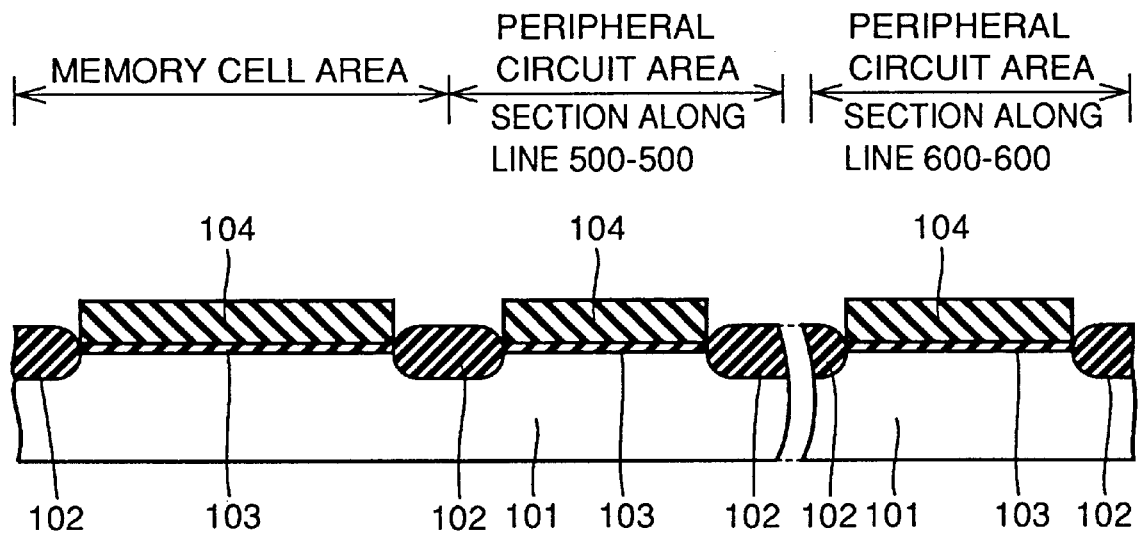
FIGS. 44 to 59 are sectional views for illustrating first to sixteenth steps of fabricating the conventional semiconductor device shown in FIG. 41.
Figure 45:
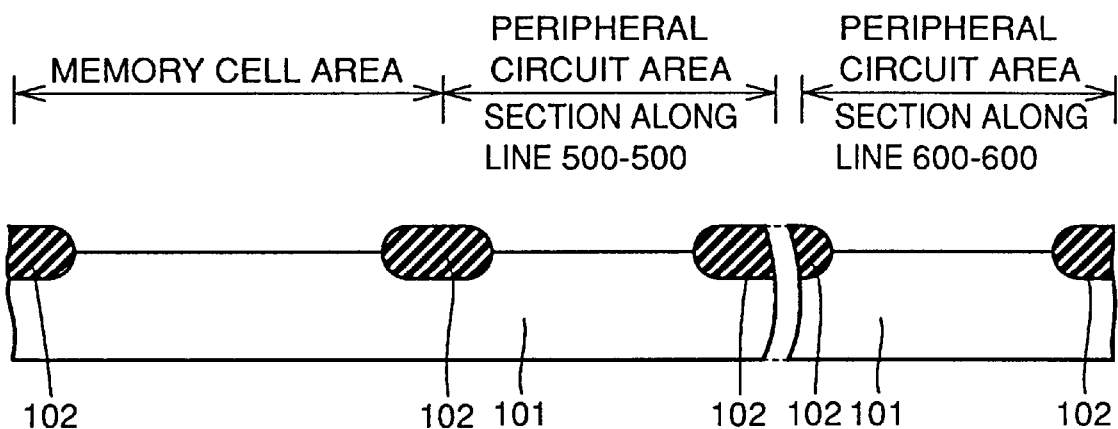
Figure 46:
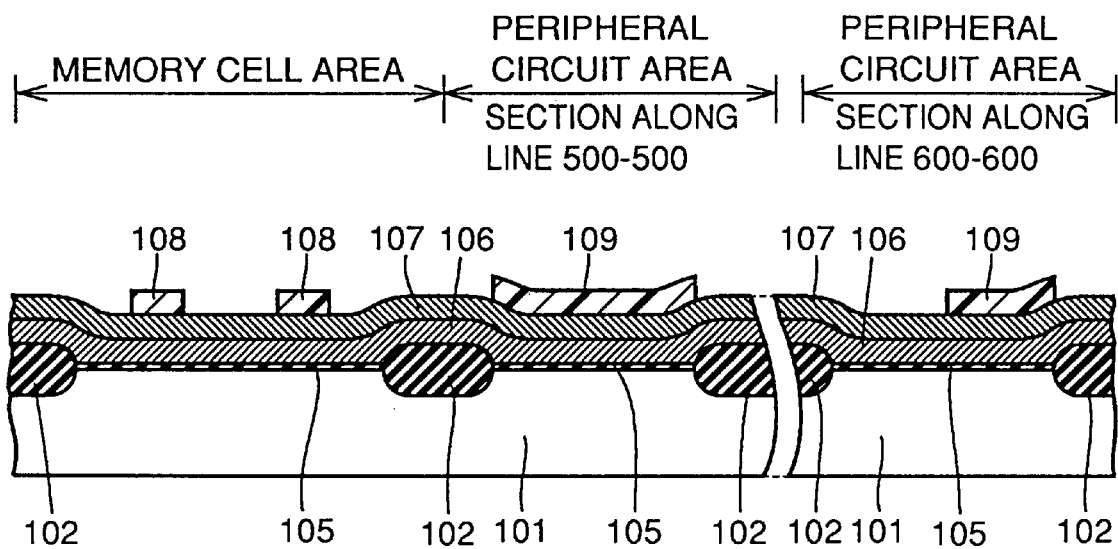
Figure 47:
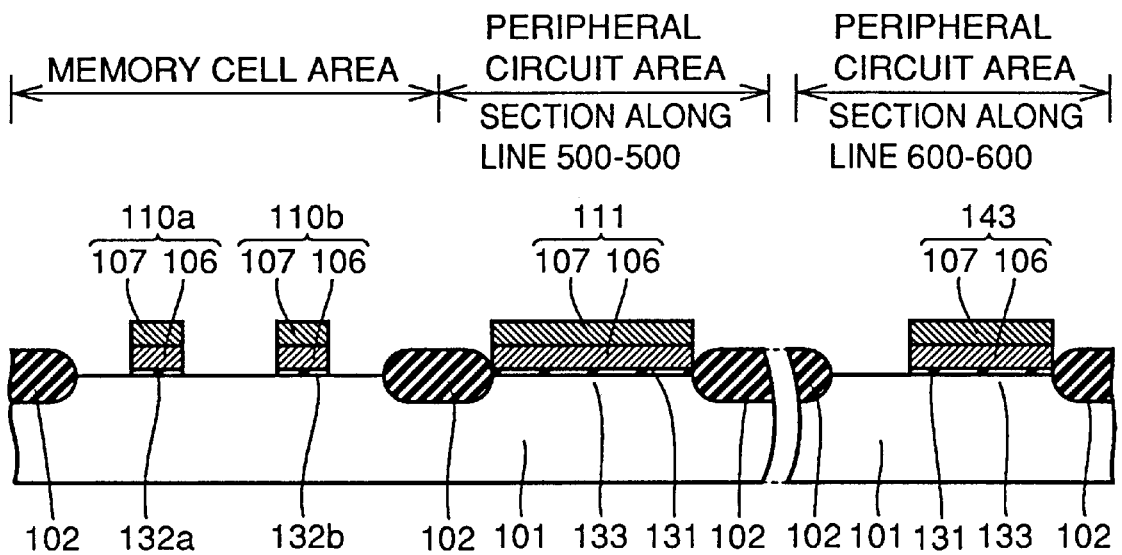
Figure 48:
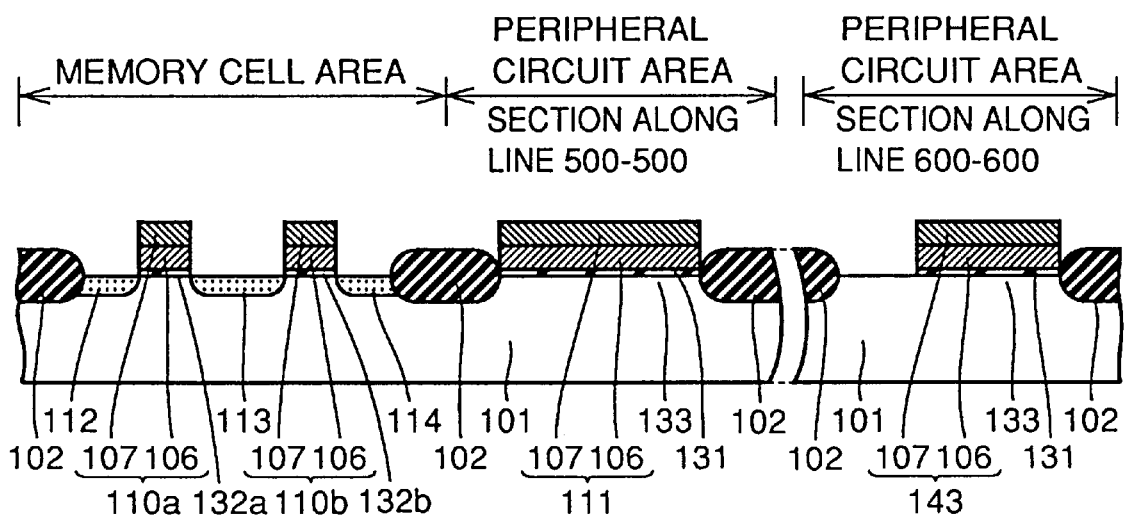
Figure 49:
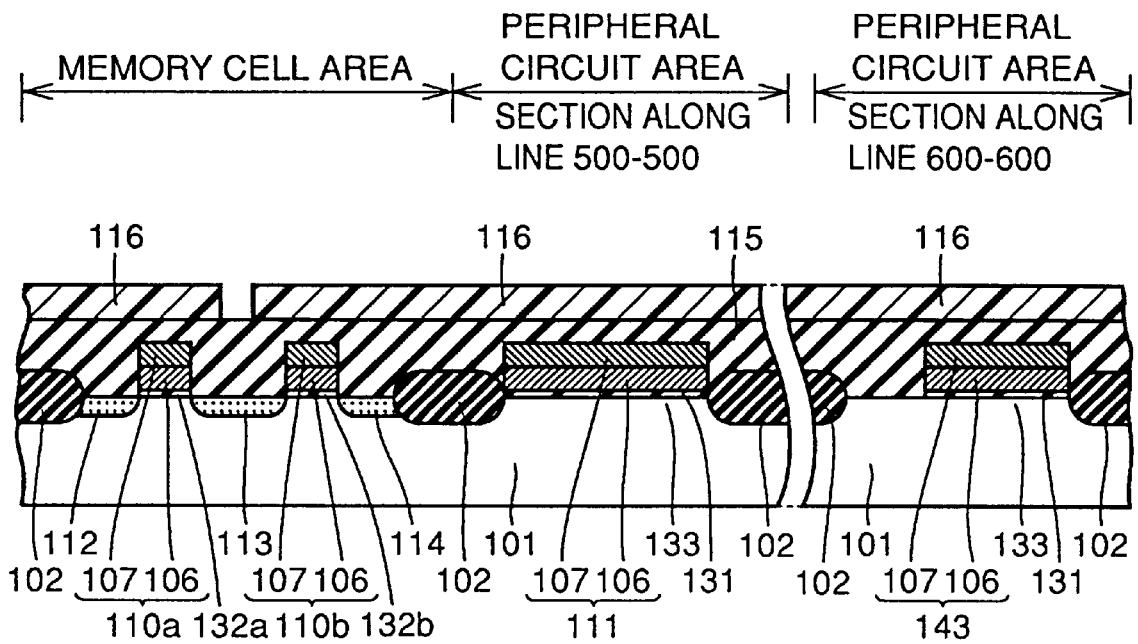
Figure 50:
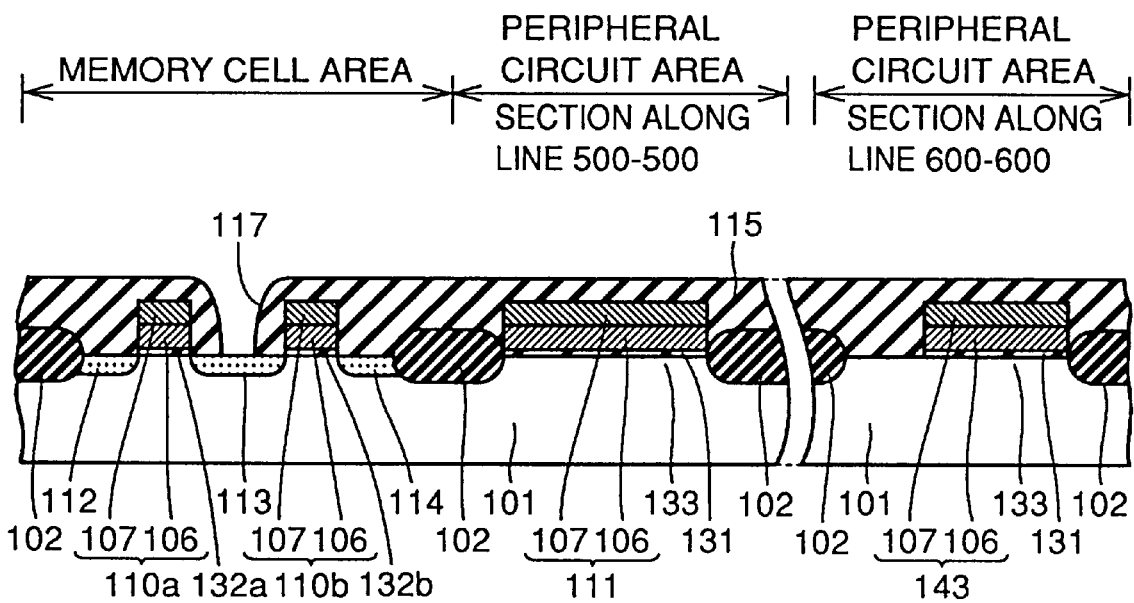
Figure 51:
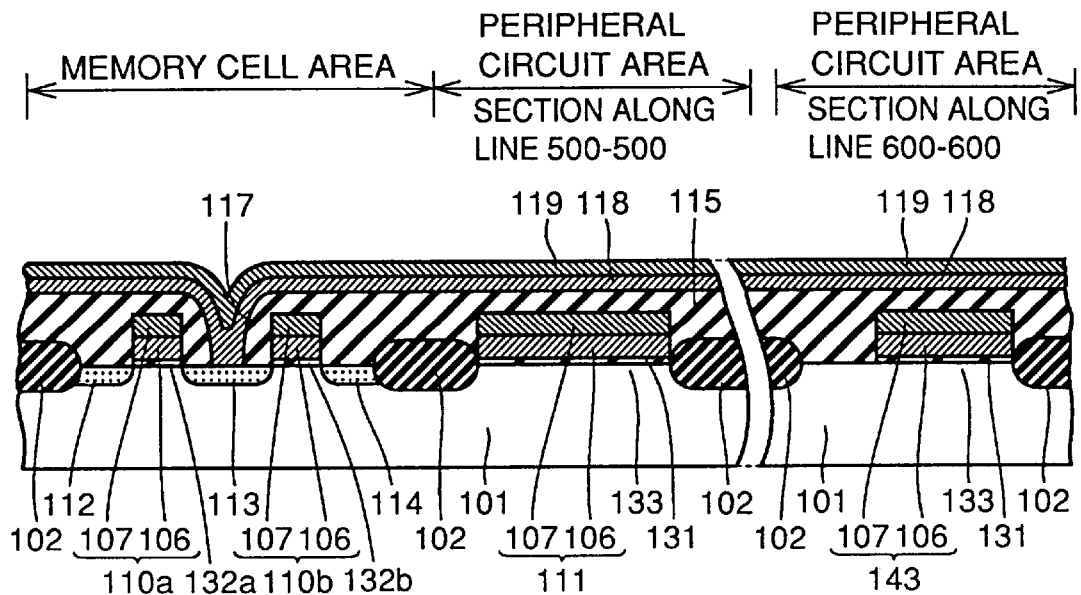
Figure 52:
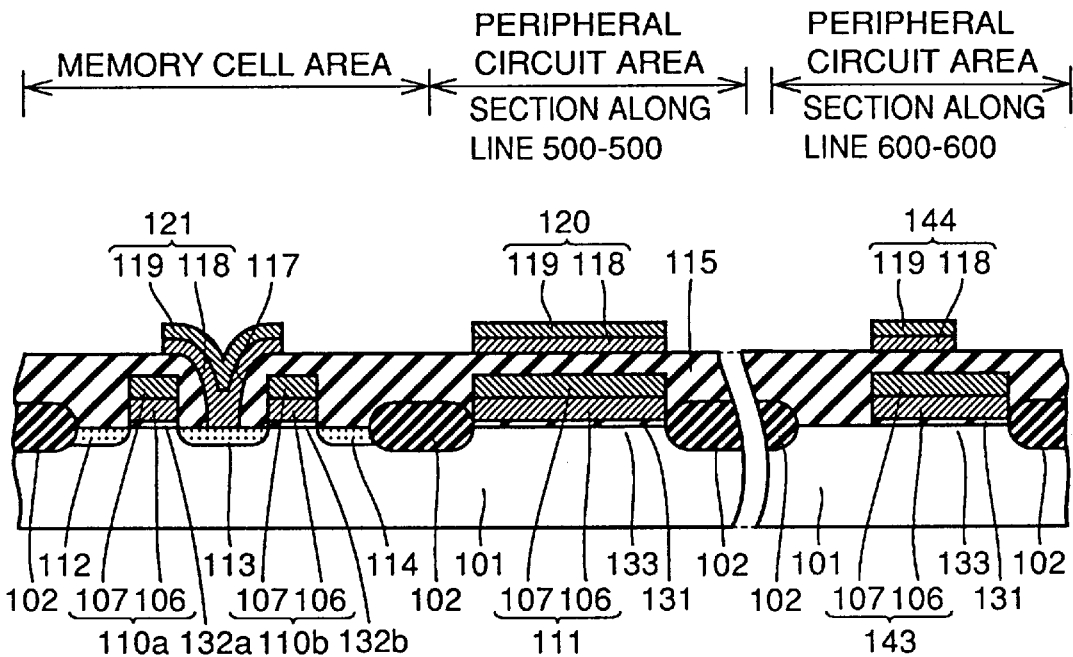
Figure 53:
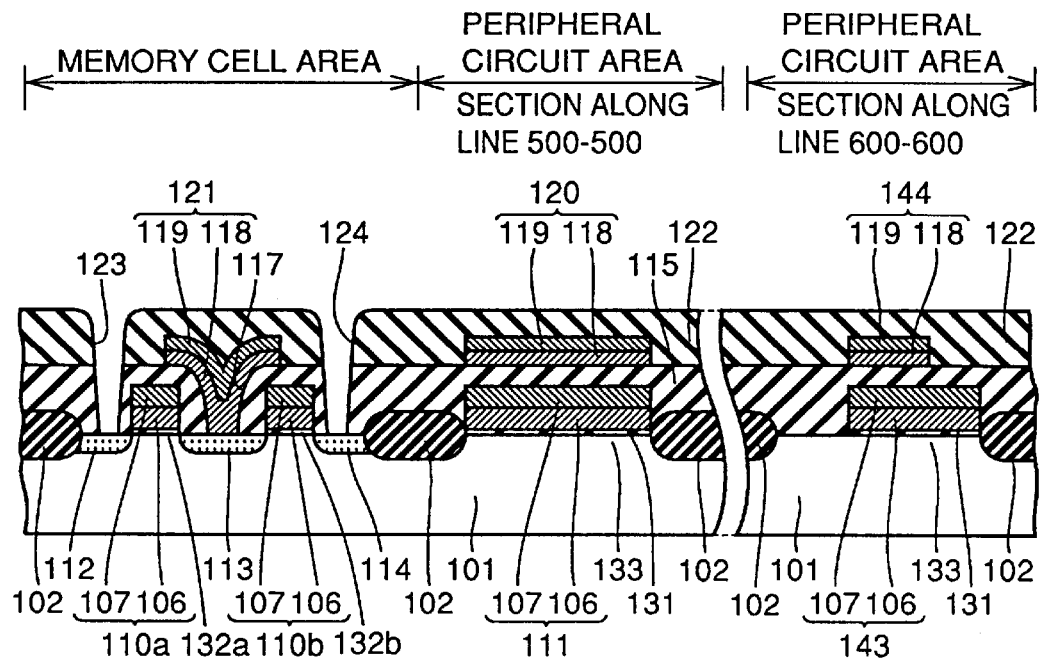
Figure 54:
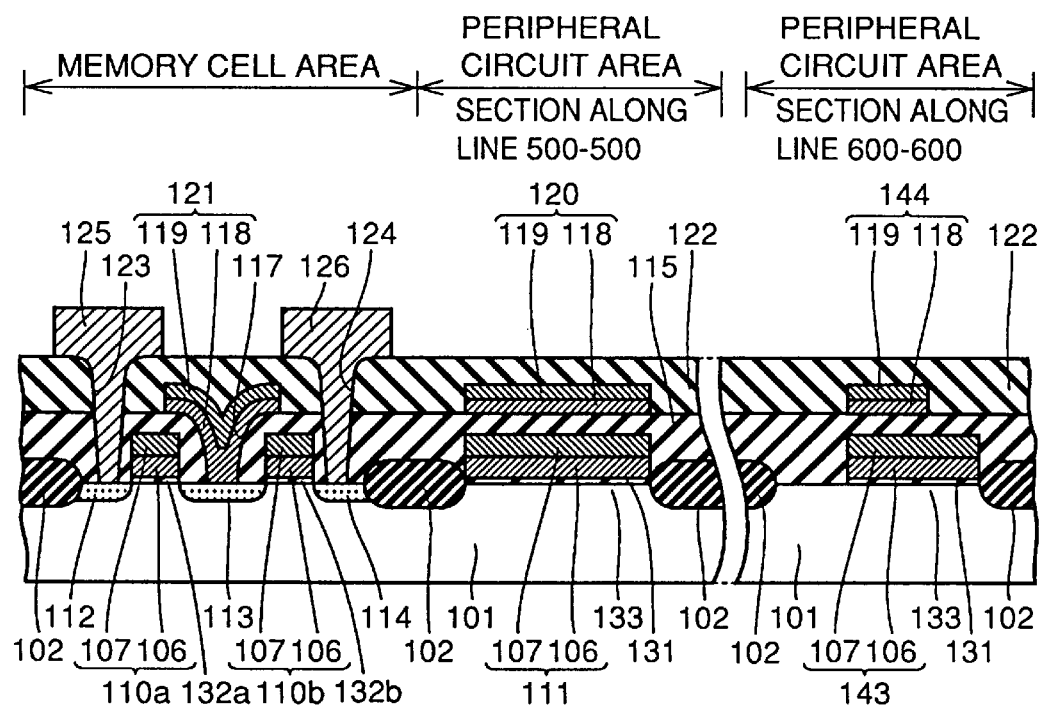
Figure 55:
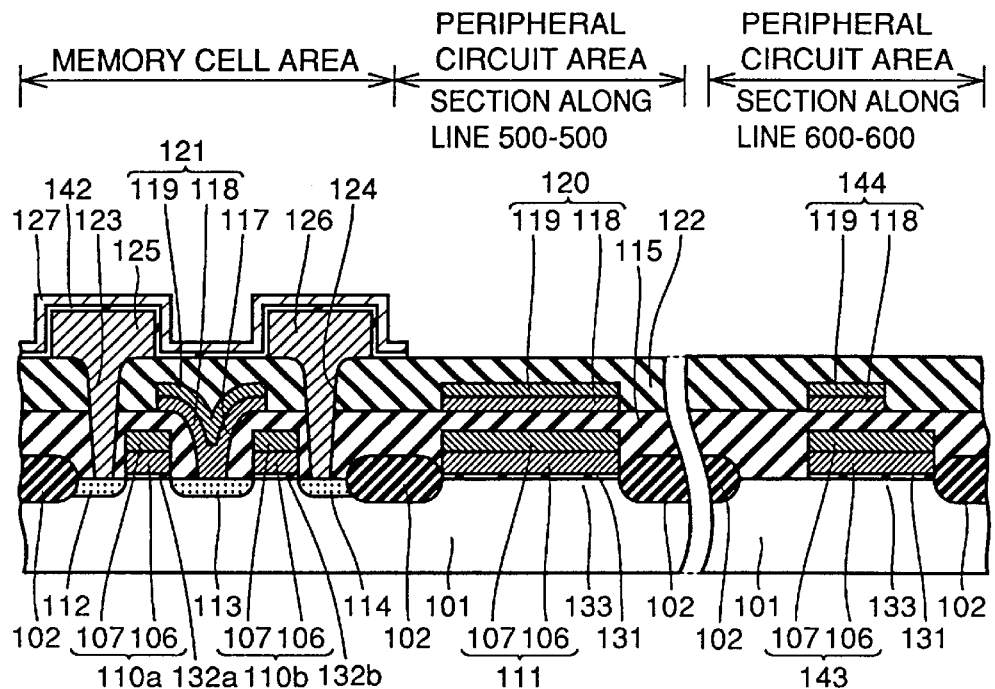
Figure 56:
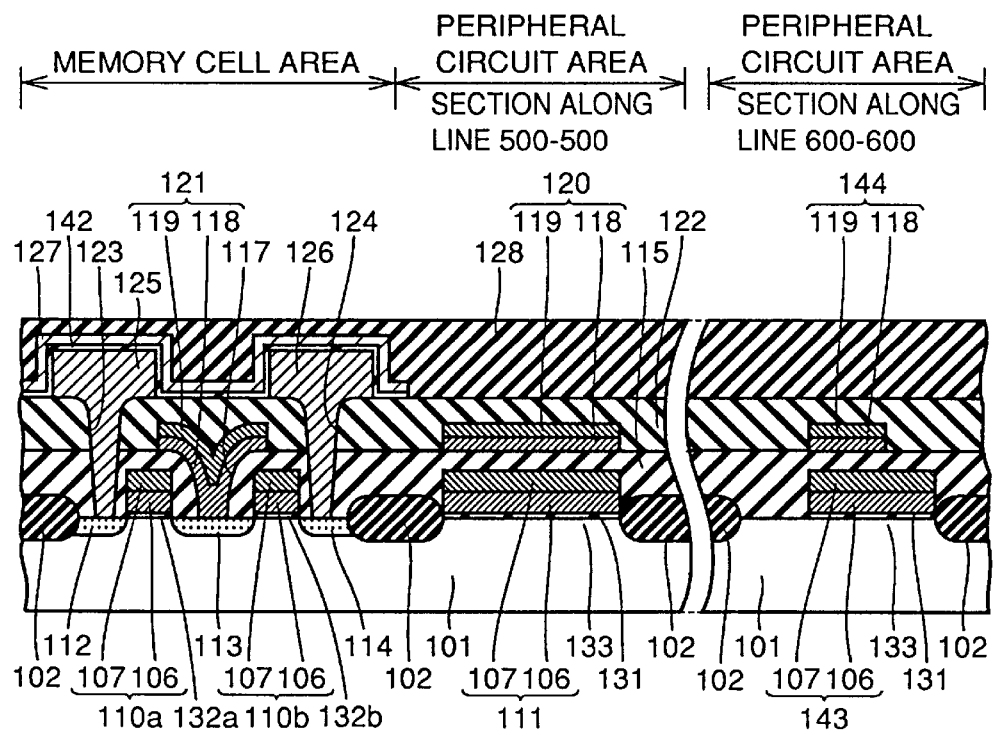
Figure 57:
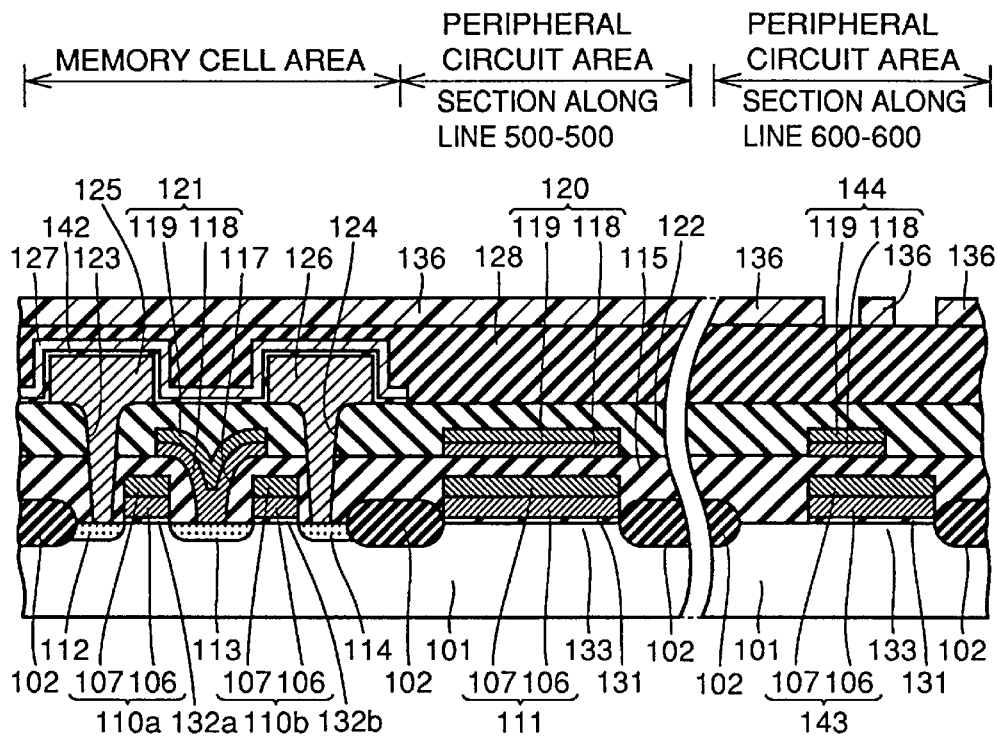
Figure 58:
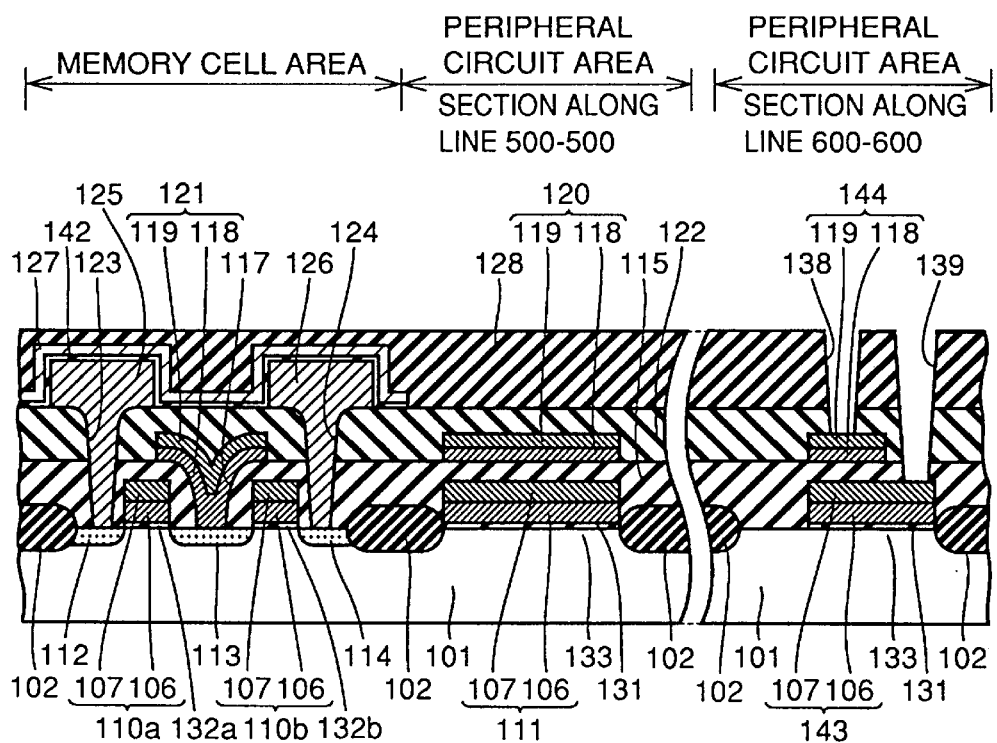
Figure 59:
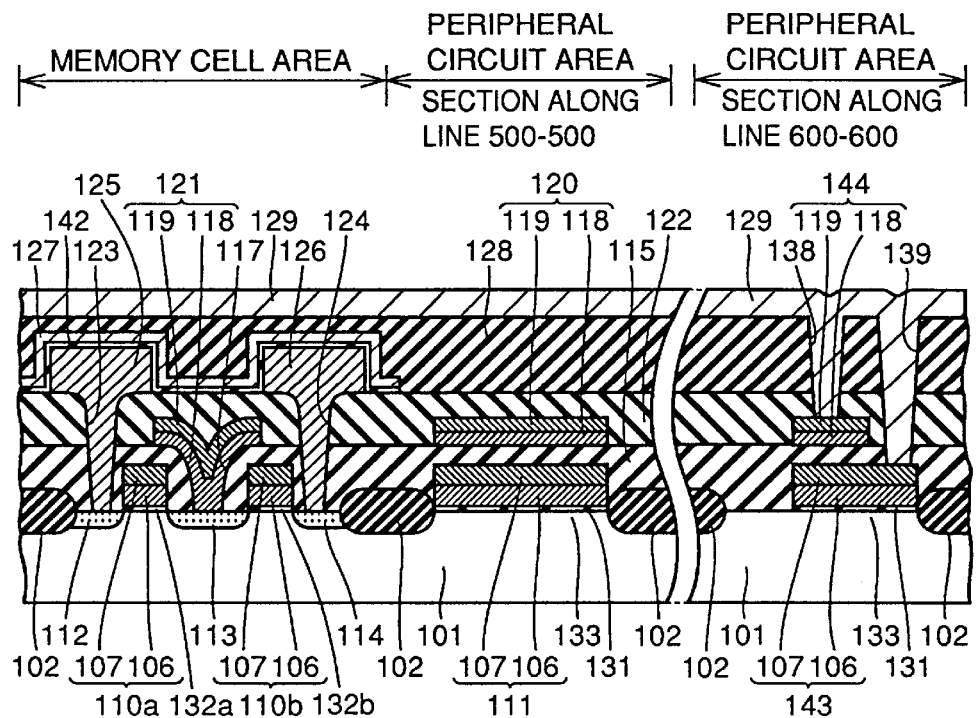
Figure 60:
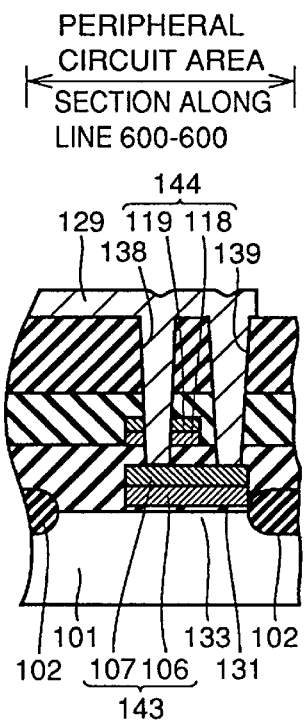
FIG. 60 is a sectional view showing an opening 138 reaching a first connecting region 143 of the capacitor in the peripheral circuit area of the conventional semiconductor device.

Then, A metal layer 29 is formed in the openings 37, 38, 41 and 39 and on the fourth interlayer isolation film 46, as shown in FIG. 40.

Thereafter resist patterns (not shown) are formed on the metal layer 29 and employed as masks for partially removing the metal layer 29 by anisotropic etching. Thus, the semiconductor device shown in FIG. 20 is obtained.

The metal wire 35 (see FIG. 20) connects the first and third electrodes 11 and 40 with each other through the openings 41 and 39 while the metal wire 34 (see FIG. 20) connects the second and fourth electrodes 20 and 48 with each other through the openings 37 and 38, whereby the plurality of capacitors can be connected in parallel with each other in the peripheral circuit area. Even if the areas of the first to fourth electrodes 11, 20, 40 and 48 are reduced to reduce the occupied areas of the capacitors, therefore, necessary capacitances can be ensured by connecting the plurality of capacitors in parallel with each other. Consequently, it is possible to reduce the occupied areas of the capacitors in the peripheral circuit area while ensuring constant capacitances required for these capacitors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a capacitor including a first electrode consisting of a first conductive layer being formed in a logic circuit area, a first dielectric film consisting of a first interlayer isolation film being formed on said first electrode, a second electrode consisting of a second conductive layer being formed on said first dielectric film, a second dielectric film consisting of a second interlayer isolation film being formed on said second electrode, and a third electrode consisting of a third conductive layer being formed on said second dielectric film;
    a third interlayer isolation film being formed on said third electrode;
    a first opening being formed at least through said first, second and third interlayer isolation films to reach the upper surface of said first electrode;
    a second opening being formed at least through said second and third interlayer isolation films to reach the upper surface of said second electrode; and
    a third opening being formed at least through said third interlayer isolation film to reach the upper surface of said third electrode, wherein
    said first electrode has a first connecting region whose surface is exposed in said first opening,
    said second electrode has a second connecting region whose surface is exposed in said second opening,
    said third electrode has a third connecting region whose surface is exposed in said third opening, and
    said first and third connecting regions are connected with each other by a connecting wire through said first and third openings.

2. The semiconductor device in accordance with claim 1, wherein
    said second connecting region is arranged not to planarly overlap with said first electrode.

3. The semiconductor device in accordance with claim 1, further comprising:
    a conductive region being formed under said first electrode through a an insulating film to be positioned on a major surface of a semiconductor substrate, and
    a fourth opening being formed through said first, second and third interlayer isolation films to reach said conductive region,
    said second connecting region of said second electrode and said conductive region being electrically connected with each other through said second and fourth openings.

4. The semiconductor device in accordance with claim 1, further comprising:
    a fourth electrode consisting of a fourth conductive layer being formed on said third interlayer isolation film,
    a fourth interlayer isolation film being formed on said fourth electrode, and
    a fourth opening being formed through said fourth interlayer isolation film to reach said fourth electrode,
    said second and fourth electrodes being electrically connected with each other through said second and fourth openings.

5. The semiconductor device in accordance with claim 1, wherein
    said logic circuit area is a peripheral circuit area in a semiconductor memory device comprising a memory cell area and said peripheral circuit area.

6. A semiconductor device comprising a memory cell area and a peripheral circuit area, wherein
    said memory cell area includes:
    a field-effect transistor having a pair of source/drain regions being formed on a major surface of a semiconductor substrate to hold a channel region therebetween, a gate insulating film being formed on said channel region, and a gate electrode consisting of a first conductive layer being formed on said gate insulating film;
    a first interlayer isolation film being formed on said gate electrode;
    a bit line consisting of a second conductive layer being electrically connected to one of said source/drain regions and extending on said first interlayer isolation film;

a second interlayer isolation film being formed on said bit line;

a capacitor having a lower electrode being electrically connected to another one of said source/drain regions and extending on said second interlayer isolation film, a dielectric film being formed on said lower electrode, and an upper electrode consisting of a third conductive layer being formed on said dielectric film;

a third interlayer isolation film being formed on said upper electrode; and a wiring layer being formed on said third interlayer isolation film, said peripheral circuit area includes:

a capacitor having a first electrode consisting of said first conductive layer being formed on said major surface of said semiconductor substrate, a first dielectric film consisting of said first interlayer isolation film being formed on said first electrode, a second electrode consisting of said second conductive layer being formed on said first dielectric film, a second dielectric film consisting of said second interlayer isolation film being formed on said second electrode, and a third electrode consisting of said third conductive layer being formed on said second dielectric film;

said third interlayer isolation film being formed on said third electrode;

a first opening being formed at least through said first, second and third interlayer isolation films to reach the upper surface of said first electrode;

a second opening being formed at least through said second and third interlayer isolation films to reach the upper surface of said second electrode; and a third opening being formed at least through said third interlayer isolation film to reach the upper surface of said third electrode, said first electrode has a first connecting region whose surface is exposed in said first opening, said second electrode has a second connecting region whose surface is exposed in said second opening, said third electrode has a third connecting region whose surface is exposed in said third opening, and said first and third connecting regions are connected with each other by a connecting wire through said first and third openings.

\* \* \* \* \*